(12) United States Patent
Madani et al.

(10) Patent No.: US 12,113,348 B2
(45) Date of Patent: Oct. 8, 2024

(54) END OF LINE PROTECTION

(71) Applicant: Virga Systems LLC, Cheyenne, WY (US)

(72) Inventors: Vahid Madani, Crockett, CA (US); Ronald E. Smith, Antioch, CA (US); Robert B. Stuart, San Tan Valley, AZ (US); Kenneth Hyung Choi, Santa Clara, CA (US); Justin Dongjin Choi, Santa Clara, CA (US)

(73) Assignee: Viking Sentinel Technology, LLC, Houston, TX (US)

( * ) Notice: Subject to any disclaimer, the term of this patent is extended or adjusted under 35 U.S.C. 154(b) by 5 days.

(21) Appl. No.: 17/628,545

(22) PCT Filed: Feb. 12, 2020

(86) PCT No.: PCT/US2020/017935
§ 371 (c)(1),
(2) Date: Jan. 19, 2022

(87) PCT Pub. No.: WO2020/167953
PCT Pub. Date: Aug. 20, 2020

(65) Prior Publication Data
US 2023/0318289 A1    Oct. 5, 2023

Related U.S. Application Data

(60) Provisional application No. 62/841,094, filed on Apr. 30, 2019, provisional application No. 62/806,551, filed on Feb. 15, 2019.

(51) Int. Cl.
*H02H 3/00*       (2006.01)
*G01R 19/25*     (2006.01)
(Continued)

(52) U.S. Cl.
CPC ......... *H02H 11/00* (2013.01); *G01R 19/2513* (2013.01); *H02H 3/027* (2013.01);
(Continued)

(58) Field of Classification Search
None
See application file for complete search history.

(56) References Cited

U.S. PATENT DOCUMENTS 3,560,798 A  *  2/1971  Tenebaum ............... H02H 3/07
                                                             361/73
4,184,186 A       1/1980  Barkan
(Continued)

FOREIGN PATENT DOCUMENTS

JP       05-015047 A    1/1993
JP       2581553 B2     2/1997
(Continued)

OTHER PUBLICATIONS

International Search Report and Written Opinion of the International Searching Authority, PCT/US20/17935, date of mailing Jun. 19, 2020.

*Primary Examiner* — Stephen W Jackson
(74) *Attorney, Agent, or Firm* — Wilkinson Law Office; Clinton H. Wilkinson

(57) ABSTRACT

The present disclosure pertains to detection of abnormal, risky, or aberrant conditions in a power distribution network and to corresponding trip signals being used to trip open devices such as reclosers upstream of where the abnormal condition is detected. Detection of a missing broadband over power-line signal or of an open circuit between phases of a power distribution circuit may prevent severed conductors from causing a ground fault, therefore avoiding the possibility of fire and dangerous conditions.

19 Claims, 16 Drawing Sheets

(51) Int. Cl.
 *H02H 3/027* (2006.01)
 *H02H 3/16* (2006.01)
 *H02H 3/26* (2006.01)
 *H02H 11/00* (2006.01)
 *H02J 3/00* (2006.01)
 *H02J 13/00* (2006.01)

(52) U.S. Cl.
 CPC ............... *H02H 3/16* (2013.01); *H02H 3/26* (2013.01); *H02J 3/001* (2020.01); *H02J 13/00002* (2020.01)

(56) References Cited

U.S. PATENT DOCUMENTS

| 11,112,815 B1* | 9/2021 | Wade | H02J 3/001 |
| 2020/0300905 A1* | 9/2020 | O'Regan | H02H 7/263 |

FOREIGN PATENT DOCUMENTS

| KR | 10-0835388 B1 | 6/2008 |
| KR | 10-2010-0001926 A | 1/2010 |

* cited by examiner

END OF LINE PROTECTION

CROSS-REFERENCE TO RELATED APPLICATIONS

This application claims the benefit of the priority dates of U.S. provisional application 62/841,094 filed on Apr. 30, 2019 and of U.S. provisional application 62/806,551 filed on Feb. 15, 2019.

TECHNICAL FIELD

Aspects herein generally concern management of electrical utilities, and more specifically to an end of line relay for controlling reclosers or circuit breakers during fault conditions.

BACKGROUND

Known power distribution networks include certain fault-protection by the power utility company, elements that are designed to maintain or restore power to customers when an abnormal condition has passed or has been rectified. Some such elements include reclosers, which are designed to interrupt electric flow when a fault occurs that would be harmful to the electric system. While these elements are intended to improve customer experience, automated restoration of tripped breakers and reclosers poses hazards.

Where lines are inadvertently grounded as a result of damage, reclosing the circuit may risk hazards such as electrocution, explosion, fire, and equipment damage. These risks may be so significant in certain regions (such as those prone to forest fires) that utilities disable breakers and reclosers from restoring power (automatically reclosing) throughout their entire power distribution network. Further, reclosers are typically located near transformers, and oftentimes do not detect hazards or abnormalities downstream of the transformer. Many utilities have historically only used phase and ground overcurrent protection to detect faults (e.g., abnormal conditions) to trip (i.e., open the circuit) line reclosers or substation breakers. Until recently, the utility had no tools to detect unbalanced conditions, open conductors, etc. except for overcurrent conditions. There is a need for a solution to overcome these shortcomings in power distribution networks.

DISCLOSURE

Aspects of exemplary implementations of a method disclosed herein may comprise detecting absence of a broadband over power-line (BPL) signal sent via each phase of a three-phase distribution network between an upstream interrupting device and a downstream end of line device. Some exemplary implementations may determine an abnormal condition based on an interruption of one or more of these signals and block, at least temporarily from closing, the interrupting device based on the determined condition.

Alternative or additional implementations may comprise use of high valued resistors installed between phases of the three-phase distribution network. Some exemplary implementations may use a continuity tester at or near an end of the distribution network to determine an abnormal condition based on an impedance measured between two of the phases and to temporarily block an interrupting device from closing based on the determined condition, by wirelessly sending a trip signal to the interrupting device.

The above disclosure is provided to summarily describe some aspects disclosed herein and should not be construed as limiting the disclosure or claims. Further aspects of the disclosure will be appreciated in view of the accompanying FIGs. and other portions of this specification.

DRAWINGS

The details of particular implementations are set forth in the accompanying drawings and description below. Other features will be apparent from the following description, including the drawings and claims. The drawings, though, are for the purposes of illustration and description only and are not intended as a definition of the limits of the disclosure. Like reference numerals refer to like elements throughout the specification.

FURTHER DISCLOSURE

Figure 1:
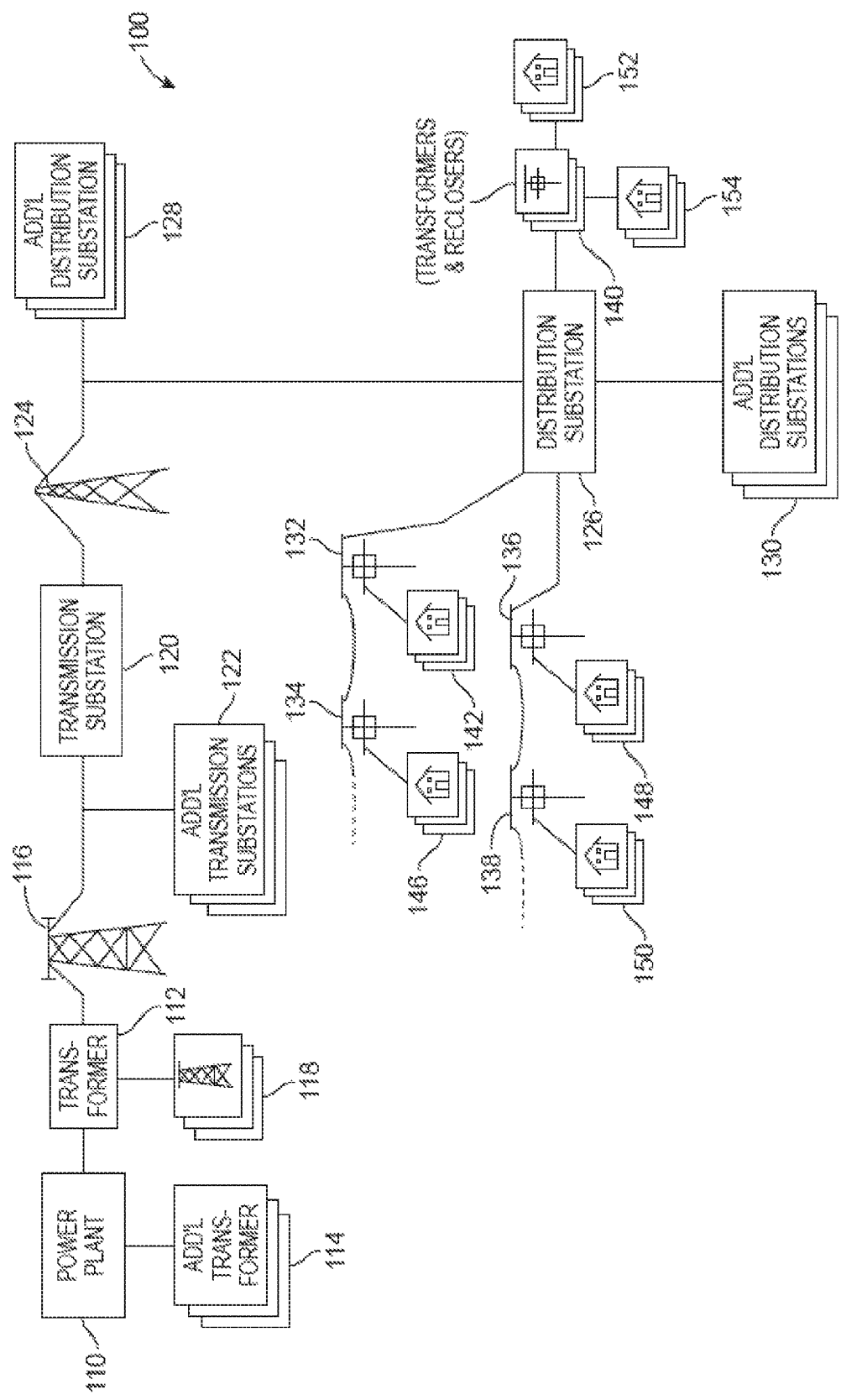
FIG. 1 illustrates an example of a typical electrical distribution network.

As used throughout this application, the word "may" is used in a permissive sense (i.e., meaning having the potential to), rather than the mandatory sense (i.e., meaning must). The words "include", "including", and "includes" and the like mean including, but not limited to. As used herein, the singular form of "a", "an", and "the" include plural references unless the context clearly dictates otherwise. As employed herein, the term "number" shall mean one or an integer greater than one (i.e., a plurality).

The disclosure here relates in some aspects to end of line relay systems and methods for locking open reclosers or breakers when an open conductor (fault) is detected at or near the end of a line in a power distribution network or at an indication of a wire down. As used herein, closing a device refers to closing a circuit to which belongs at least the device. In some exemplary implementations, a downstream device may trip a switch (e.g., an interrupter, breaker, or recloser) and block the switch from closing and thus reenergization.

As used herein, an element in a power distribution network is upstream (upline) if it is closer to a source of the power (e.g., closer to a substation or power plant), and is downstream (downline) if it is more distant from the source of power. For example, an end-of-line relay disclosed herein is downstream of the last transformer on its branch of a power distribution network. Proximity is thus herein based not on a distance in space, but rather on the distance of a line. Thus, if a branch of a power distribution network includes multiple turns and doubles back such that the end of line is located closer in space to a substation, an element at the end of the branch's line is still downstream of elements located at a greater geographic distance but closer as the line travels.

As used herein, an electrical utility may be a power distribution network, or any component or connection therein. Where a system or method interacts with an electrical utility, this generally means that the system or method involves electrical communication with one or more components (e.g., transformers, circuit breakers, wires) of a power distribution network. An electrical utility or power distribution network may include multiple parallel paths, opened or closed by switches, to maintain power to customers on one path when another is unavailable (e.g., for maintenance). Systems and methods disclosed herein function regardless of the presence of such switches and parallel paths, and are not impacted based on the opening or closing of a particular path.

As used herein, a trip signal may be any means of indicating a trip (e.g., fault, short, disconnection, spike, sag, etc.) to an electrical element. Trip signals may be generated based on faults in multiphase systems. In some exemplary implementations, a trip signal may be an electronic communication including data or logic for receipt and handling by a unit capable of interpreting data or logic formatted according to the manner provided. In some exemplary implementations, a trip signal may be an electrical and/or mechanical operation, such as the opening of a switch based on electricity provided to the switch, and such opening of the switch may result in action by other components operatively coupled with the switch.

Separate signals may be required to close a device after a trip signal opens the device, such as a recloser. Trips may be triggered based on the presence of any specified fault (e.g., any abnormality, or a specified abnormality that is detected regardless of magnitude or persistence) or based on the presence of substantial faults (e.g., abnormality has magnitude exceeding a threshold). In exemplary implementations, different types of faults may result in a trip signal, but may be associated with different conditions for triggering a trip signal (e.g., first, a fault is isolated if the fault is detected in any magnitude, second, fault trips only if substantial magnitude of abnormal condition is detected).

A reset herein may be based on the removal or clearance of a fault, restoration of all phases in multiphase systems, etc., and may be based on logic, stored data, and/or electrical, mechanical, or electromechanical function. Clearance of an abnormality resulting in provision for reset may be complete (e.g., no abnormality present) or substantial (e.g., abnormality persists but magnitude or period decreases to user acceptable and safe levels). In exemplary implementations, reset conditions for an end of line open conductor detection relay or other device (scheme) disclosed herein may permit restoring elements such as circuit breakers or line reclosers to their pre-abnormal condition only after abnormal condition has been rectified.

Aspects herein may be provided to unblock (or allow) reclosing of upstream devices (e.g., reclosers, breakers) for restoring power only after an abnormal condition is resolved.

FIG. 1 illustrates an example power distribution network 100. Network 100 provides a simplified view of environments in which apparatuses disclosed herein may be implemented. Power is generated at network 100 by power plant 110. Power output from power 110 is stepped up by one or more transformers, which may include transformer 112 and additional transformers 114, to condition the power for transmission. Tower 116 (and additional towers 118) may provide lines carrying very high voltage power (e.g., 60 kV or more) to transmission substations such as transmission substation 120 (and additional transmission substations 122). Downline from transmission substations, power lines carrying high voltage (e.g., 60-500 kV) may carry power to distribution substation 126 and/or additional distribution substations 128.

Distribution substation 126 is shown as a hub of a power sub-network within power network 100 such that it is the substation conditioning power and providing it to various users. Distribution substation 126 connects to electrical poles 132, 134, 136, 138, and 140, which connect, respectively, to various loads 142, 146, 148, 150, 152, and 154 (which may be, e.g., residential loads, commercial loads, industrial loads, or any other) and/or other electrical poles. Each of electrical poles 132, 134, 136, 138, and 140 includes a transformer that steps down the electrical power for use at the load.

Each of electrical poles 132, 134, 136, 138, and 140 may also include a recloser. Alternatively or complementarily, reclosers may be situated elsewhere in network 100. Reclosers are electrical elements configured to restore power after transient faults and/or isolate sections of network 100 by detecting and interrupting momentary faults from shorts, overloads, etc. For short-lived faults, such as those caused by lightning strikes, surges, or objects such as tree branches temporarily contacting lines, reclosers provide rapid restoration of power. More, because of their distribution at multiple points, power may be maintained or restored to areas unaffected by a persistent fault.

As discussed, network 100 is provided as an example for purposes of simple explanation. The power network may branch at a variety of locations other than those pictured. For example, while only one line is shown from power substation 120 to tower 124, it is understood that multiple lines may go to a variety of towers, and almost any element of power network 100 may act as a hub having a variety of spokes extending therefrom to carry power to additional elements. More, additional elements may be added, or certain elements removed, from power networks without departing from the scope or spirit of the innovation.

While FIG. 1 and other illustrations herein depict both distribution and transmission networks, exemplary implementations of devices herein may be directed to safety in distribution networks utilizing line reclosers. Such distribution networks may operate at various voltages and currents, but in exemplary implementations may operate using voltages less than or equal to 34.5 kV (or other voltages such as 21 kV, 12 kV, or lower, etc.). Further, such distribution networks may be arranged anywhere throughout larger electrical networks, but in exemplary implementations may be downstream of distribution substations, FIG. 12, as reference examples of a single line system.

Figure 2:
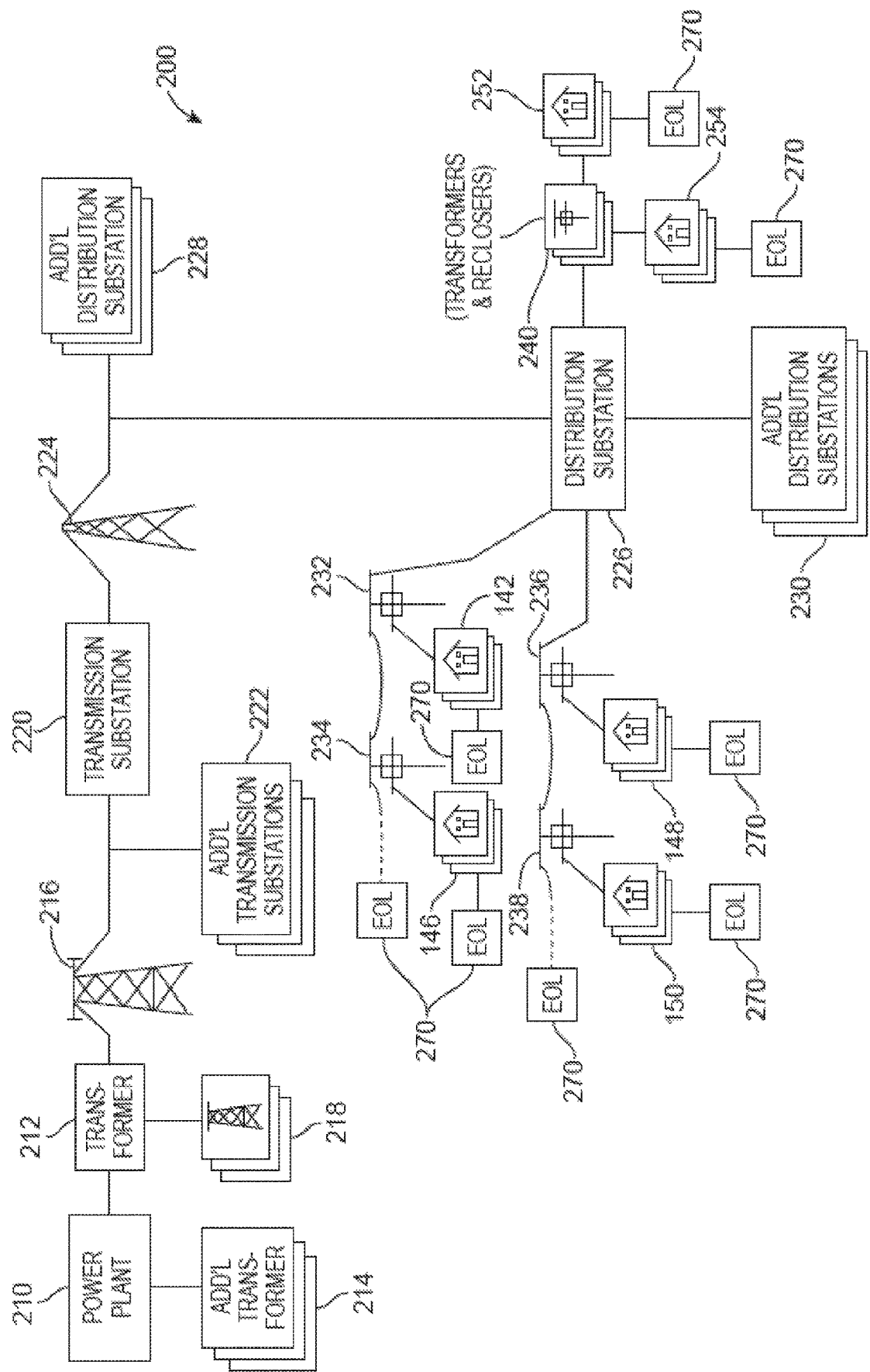
FIG. 2 illustrates an example electrical distribution network including end of line relay devices, according to one or more exemplary implementations.

FIG. 2 illustrates an example power distribution network 200. Network 200 provides a simplified view of environments in which apparatuses disclosed herein may be implemented. Power is generated at network 200 by power plant 210. Power output from power 210 is stepped up by one or more transformers, which may include transformer 212 and additional transformers 214, to condition the power for transmission. Tower 216 (and additional towers 218) may provide lines carrying very high voltage power (e.g., 60 kV, 115 kV, etc.) to transmission substations such as transmission substation 220 (and additional transmission substations 222). Downline from transmission substations, power lines carrying high voltage (e.g., 60-500 kV) may carry power to distribution substation 226 and/or additional distribution substations 228.

Distribution substation 226 is shown as a hub of a power sub-network within power network 200 such that it is the substation conditioning power and providing it to various users. Distribution substation 226 connects to electrical poles 232, 234, 236, 238, and 240, which connect, respectively, to various loads 242, 246, 248, 250, 252, and 254 (which may be, e.g., residential loads, commercial loads, industrial loads, or any other) and/or other electrical poles. Each of electrical poles 232, 234, 236, 238, and 240 includes a transformer that steps down the electrical power for use at the load.

Each of electrical poles 232, 234, 236, 238, and 240 may also include a recloser. Typical reclosers may include four operations prior to lockout that may all be completed, e.g., within 30 seconds while substation breakers have three operations to lockout within these 30 seconds. Alternatively or complementarily, reclosers may be situated elsewhere in network 200. As noted above, reclosers are electrical elements configured to restore power after transient faults and/or isolate sections of network 200 by detecting and interrupting momentary faults from shorts, overloads, etc. However, this presents problems for certain persistent faults. Specifically, if a line is down, in repeated or continuous contact with an object, or is otherwise damaged to the point of requiring service, reenergizing or attempting to reenergize the line increases the risk of fire, electrocution, and other dangers. Even reclosers which lock open after a certain number of attempts to restore power may cause these disastrous outcomes by providing power to interrupted or damaged lines.

Figure 12:
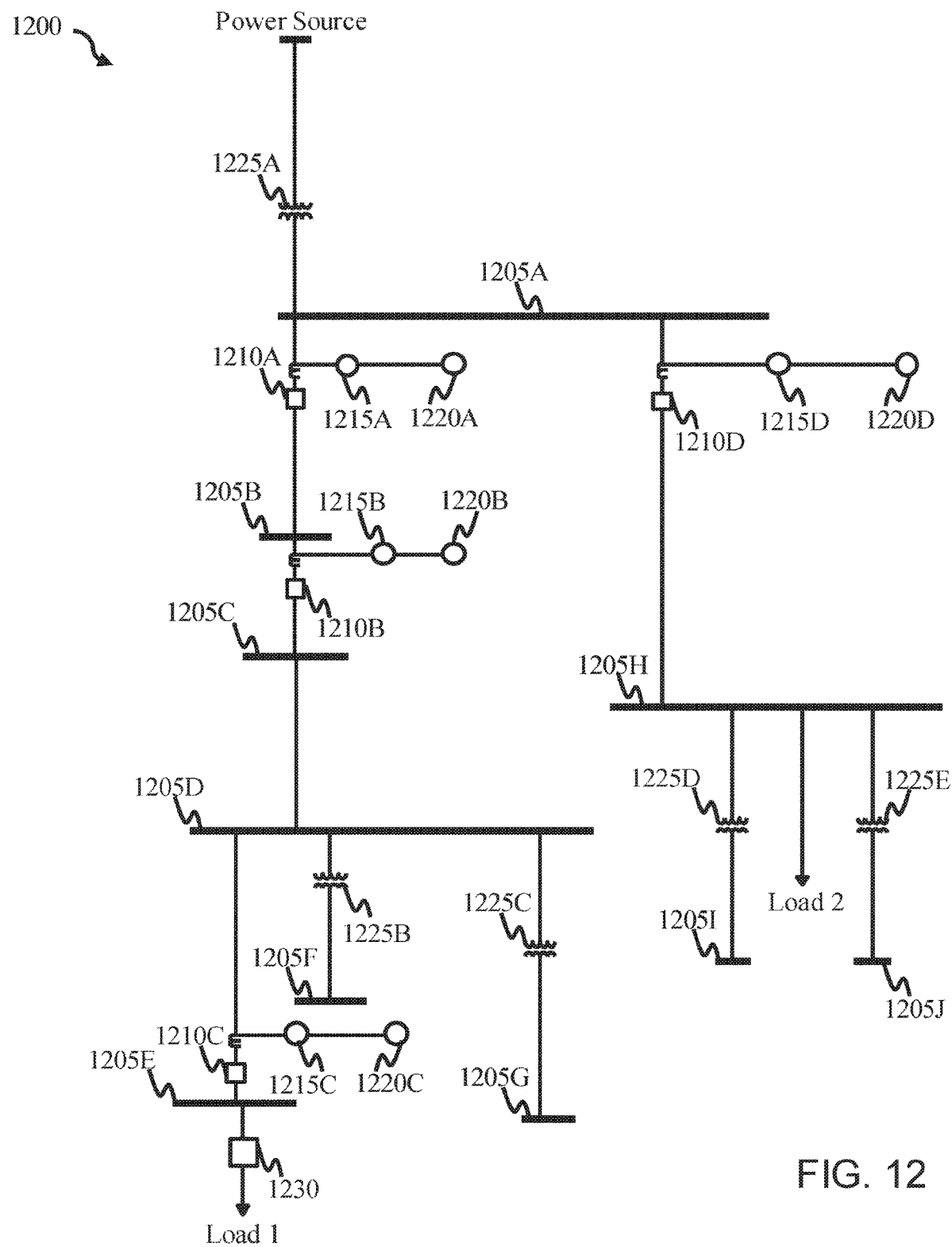
FIG. 12 illustrates a single-line power distribution topology, according to one or more exemplary implementations.

To address the hazards of traditional reclosers, network 200 includes end of line (EOL) devices 270 (which are also shown in FIG. 12 as element 1230). End of line devices 270 may cause immediate lock open of reclosers on detection of a fault, back-propagating a lock-open signal to reclosers to prevent closing of circuits where reintroduction of electrical power could result in harm. End of line devices 270 look back upstream toward the recloser or breaker to provide a response to abnormalities. This is distinct from utility practices that arrange sensors upstream of locations where faults occur, which may not detect open conductors downstream. In exemplary implementations, the abnormality may be a severed line. However, in alternative or complementary exemplary implementations, end of line devices 270 may respond to other abnormalities.

End of line devices 270 may be the same devices or different variants of devices described herein but share common functionality. Particularly, end of line device 270 may include a relay and transmitter providing real-time response to compromised power circuits, providing a view from the end of the line (e.g., a most downstream element) looking back. End of line devices 270 may ensure the entire line, e.g., back to the power substation, is monitored and may ensure rapid de-energization of lines. In exemplary implementations, device 270 may break an electrical circuit and deenergize lines faster than the conductor may fall if severed. In the event of a fault, end of line device 270 may provide a trip open signal in such a way that reclosers upstream from the end of line device are tripped and blocked from reclosing.

More particularly, each end of line device 270 may be installed at an electrical pole or cross-arm, or other locations, in the final section or span of a radial fed circuit within a power distribution network. End of line devices 270 may alternatively or complementarily be installed between circuit switchers, reclosers, and/or substation breakers.

In exemplary implementations, when potential is lost in one of the three phases of a three-phase distribution line, a negative sequence is detected and end of line device 270 may instantaneously send a trip signal to open the recloser and block it from reclosing. The trip signal may be sent to a nearest recloser or all reclosers upstream of a given end of line device 270. This blocking of re-closure prevents the recloser from restoring the circuit, which presents risks of fire, equipment damage, or even injury and death to people and animals near a downed power line.

While alternatives are contemplated herein, end of line devices 270 may generally include one or more sensors and a signaling mechanism, such as a transmitter. The sensors may detect, e.g., voltage or amperage differential, including negative sequence voltage in power distribution networks utilizing three phase (or other multi-phase) transformers. The tripping mechanism is configured to trip on detection of an abnormality. Based on this tripping, the transmitter may provide a trip signal to at least one recloser or breaker upstream from the end of line device 270, cutting power to the faulted section. This near-instantaneous shutoff reduces the risk of harm to people or objects and prevention of fire in the vicinity of a fault.

In various exemplary implementations, end of line devices 270 (or other end of line devices disclosed herein) may be toggled on or off in network 200 (or other networks) manually or automatically. In this fashion, reclosers may be permitted to operate as normal during low risk conditions (e.g., low winds, above-freezing temperatures, low fire hazard, or others) but may be overridden by end of line devices 270 when the risk of persistent faults increases.

End of line device 270 may be configured for integration in an existing infrastructure, and it may be installed using a hot stick (i.e., a device used by utilities to install equipment while the circuit is still energized) that does not require portions of the power distribution network to be deenergized.

Some exemplary implementations of end of line devices 270 may be described at least in part as or include a negative sequence voltage relay, a differential relay, a loss of phase relay, phase imbalance relay, single/double phase loss or comparison relay, or another device (or devices) monitoring 3-phase voltage or 3-phase current. Trip signals are sent to reclosers or breakers based on abnormalities detected by such relays or devices. End of line devices 270 may allow a line section to be de-energized prior to a conductor reaching the ground should a splice fail or a conductor break for any reason (e.g., failed splice, failed insulator, failed cross-arm, car-pole accident, lightning strike).

End of line devices 270 may be configured to communicate only with a nearest recloser or group of reclosers to limit the scope of outages and assist with finding the fault in a power distribution network. The nearest recloser may be the next recloser upstream from an end of line device 270. However, additional reclosers or circuit breakers may be involved based on utility coordination. For example, in one exemplary implementation, two ends of line branches from a single transformer (e.g., forming a "V" with the transformer at the vertex). In this case, two end of line relays may be configured to trip a single recloser located at the transformer. Alternatively, two transformers may feed to a single end of line (e.g., forming a "V" with the end of line device 270 at the vertex). Here, an end of line device 270 may be configured to trip open both reclosers. A utility may configure an end of line device to trip open a nearest recloser and/or a next nearest recloser (or additional reclosers) further upstream. An end of line device may in exemplary implementations be arranged mid-line, between two transformers, to provide similar protection for faults at intermittent locations.

End of line devices 270 may work with a variety of voltages including but not limited to 120 V, 480 V, 4160 V, 12 kV, 13.8 kV, 21 kV, 34 kV, and any others above or below these levels. The onboard sensors may provide three phase voltage inputs for any voltages, including 120 V to 34 kV (or higher or lower voltages). A trip signal component or device within or used by some exemplary implementations of end of line devices 270 may include but are not limited to low voltage, high voltage, on/off switch, negative sequence voltage, phase loss, phase comparison, under-voltage, ground trip, non-ground trip, or other device, mechanism or component.

In some exemplary implementations, after one or more end of line devices 270 trip, the utility may perform various actions to discover the cause of the fault. After the downed line, damaged transformer, or other element is repaired, end of line device(s) 270 may auto-reset based on restoration of appropriate power from the three-phase transformer. In exemplary implementations, a switching center or other utility node may reenable reclosers (e.g., with System Control And Data Acquisition (SCADA)), breakers, or other elements which were tripped open by end of line device(s) 270, thereby safely restoring power.

As discussed, network 200 is provided as an example for purposes of simple explanation. The power network may branch at a variety of locations other than those pictured. For example, while only one line is shown from power substation 220 to tower 224, it is understood that multiple lines may go to a variety of towers, and almost any element of power network 200 may act as a hub having a variety of spokes extending there from to carry power to additional elements. More, additional elements may be added, or certain elements removed, from power networks without departing from the scope or spirit of the innovation. In some exemplary implementations, voltage magnitudes measured at an end of line device and/or relative phase angles (between the three phases) derived based on the voltage magnitudes may be communicated to a central location to allow comparison of the voltages and the voltage-angles to validate system topology at a time of detecting an open conductor. Devices of FIG. 2 may store data related to measurements and share or transmit stored data to other devices in this figure (or not depicted therein) or to databases.

In some exemplary implementations, end of line device 270 may detect an open conductor anywhere in the power distribution system (e.g., from a substation to device 270), and it may prevent reclosing, e.g., before a line (i.e., the open conductor) falls from a pole or tower down to the ground. Device 270 may prevent the reclosing by transmitting a trip signal over another wire or wirelessly that may or may not bypass a transformer.

Figure 3:
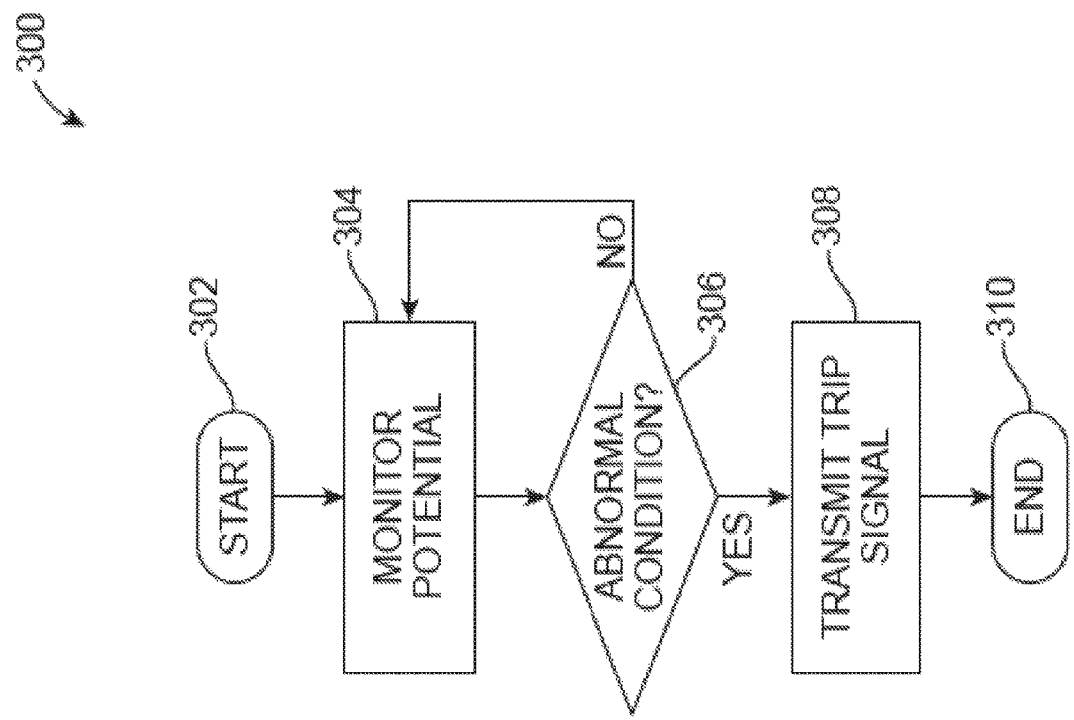
FIG. 3 illustrates an example method using end of line relay devices for monitoring and detection of a broken conductor, according to one or more exemplary implementations.
Figure 14:
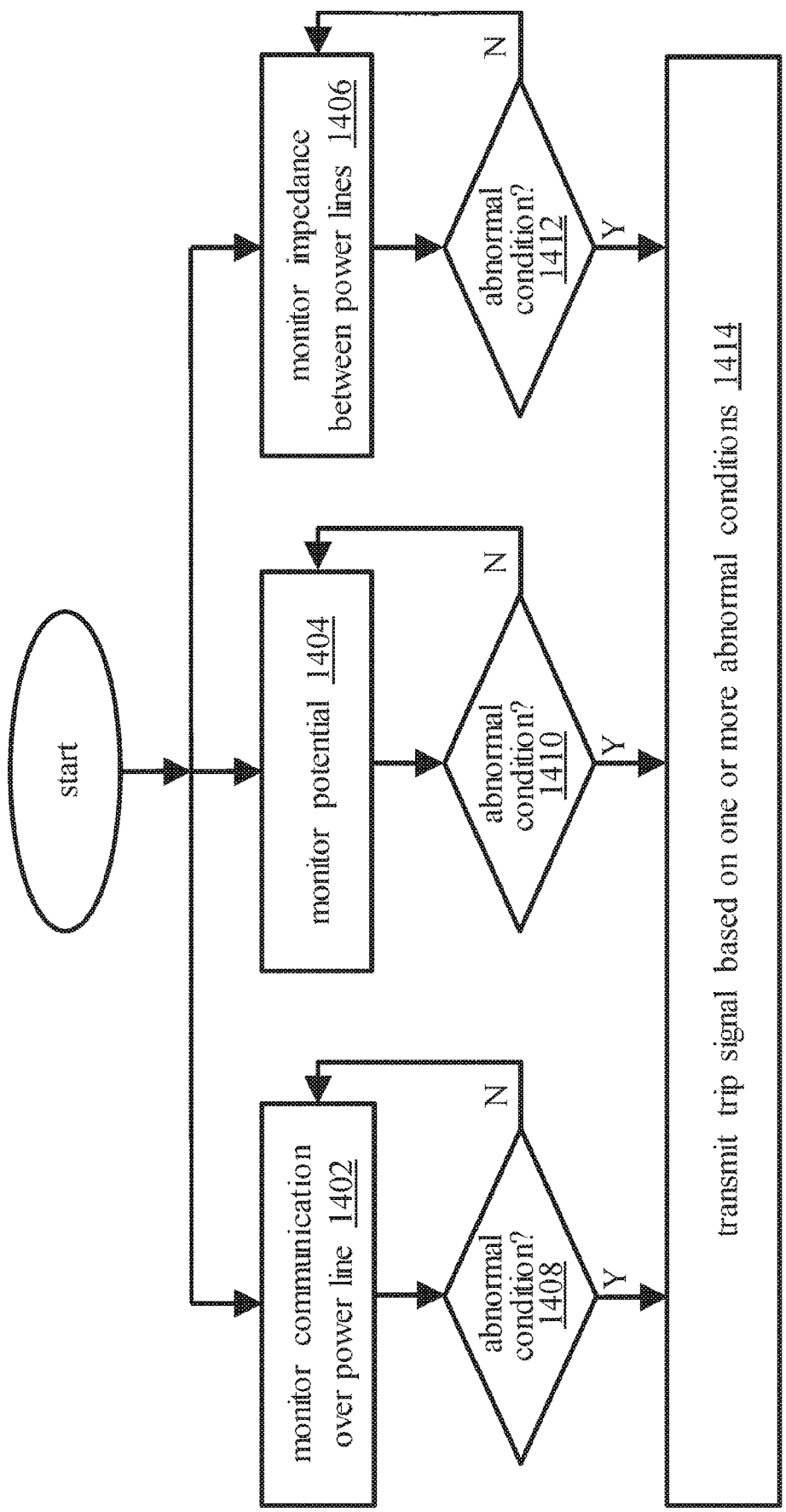
FIG. 14 illustrates different methodologies for performing end-of-line fault detection, according to one or more exemplary implementations.

FIG. 3 illustrates an exemplary implementation of an example methodology 300 disclosed herein, similarly presented in FIG. 14 with additional user optional implementation for enhanced security of proposed exemplary implementation. Methodology 300 begins at 302 and proceeds to 304 where a potential is monitored. Monitoring may be active or passive. Active monitoring may receive and process electrical activity to determine periodic or instantaneous values for, e.g., voltage and/or amperage differentials. Passive monitoring may utilize circuit elements designed to trip or actuate based on the presence or absence of particular electrical characteristics. Such aspects may comprise measuring a potential from a transformer at an end of a distribution line in an electrical distribution network. Measurements may be performed using a sensor. Sensors may include, but are not limited to, voltage differential sensors, amperage differential sensors, and others. Voltage sensors may be capacitive voltage sensors, resistive voltage sensors, or others, and combinations thereof. Amperage sensors may be inductive current sensors, closed-loop current sensors, open-loop current sensors, or others, and combinations thereof. Single-ended voltage or current measurements may alternatively or complementarily be determined by one or more sensors.

At 306 a determination is made as to whether an abnormal condition exists in the electrical distribution network. This determination may be made using the monitored potential and/or other sensor information. Abnormal conditions may include, but are not limited to, faults from equipment failure, human error, or environmental conditions, which may result in surges or sags in voltage or current and/or short circuits. These phenomena may result in equipment damage, power outages, fires, electrocution, and other dangers. Abnormal conditions may be determined as an absolute (e.g., any abnormal condition regardless of magnitude or duration) or as a substantial abnormality (e.g., condition detected exceeds certain voltage or current value versus ground or a comparative value, condition detected persists longer than a threshold length or occurs more than a threshold number of times). As mentioned, abnormal conditions may be indicative of a downed conductor, blown fuse, or other conditions. In the event of a downed conductor, techniques implemented at the end-of-line may prevent a recloser from reclosing of a circuit that could energize a downed wire. Techniques implemented at the end-of-line may also limit the scope of an outage or area to be deenergized.

If the determination at 306 returns negative, methodology 300 may recycle to 304 where the potential continues to be monitored. However, if the determination at 306 returns positive, methodology 300 may proceed to 308 where a trip signal is generated and transmitted. The trip signal may be transmitted to a breaker or recloser based on detection of the abnormal condition. The breaker or recloser to which the trip signal is transmitted may be upstream from the sensor. The breaker may be a breaker at a substation, or other breaker in network 200 or as is utilized in alternative power distribution networks. In exemplary implementations, the trip signal is configured to cause the breaker to trip open, overriding any closing or reclosing logic or functionality configured therein. After transmitting the trip signal, methodology 300 may end at 310.

Figure 4:
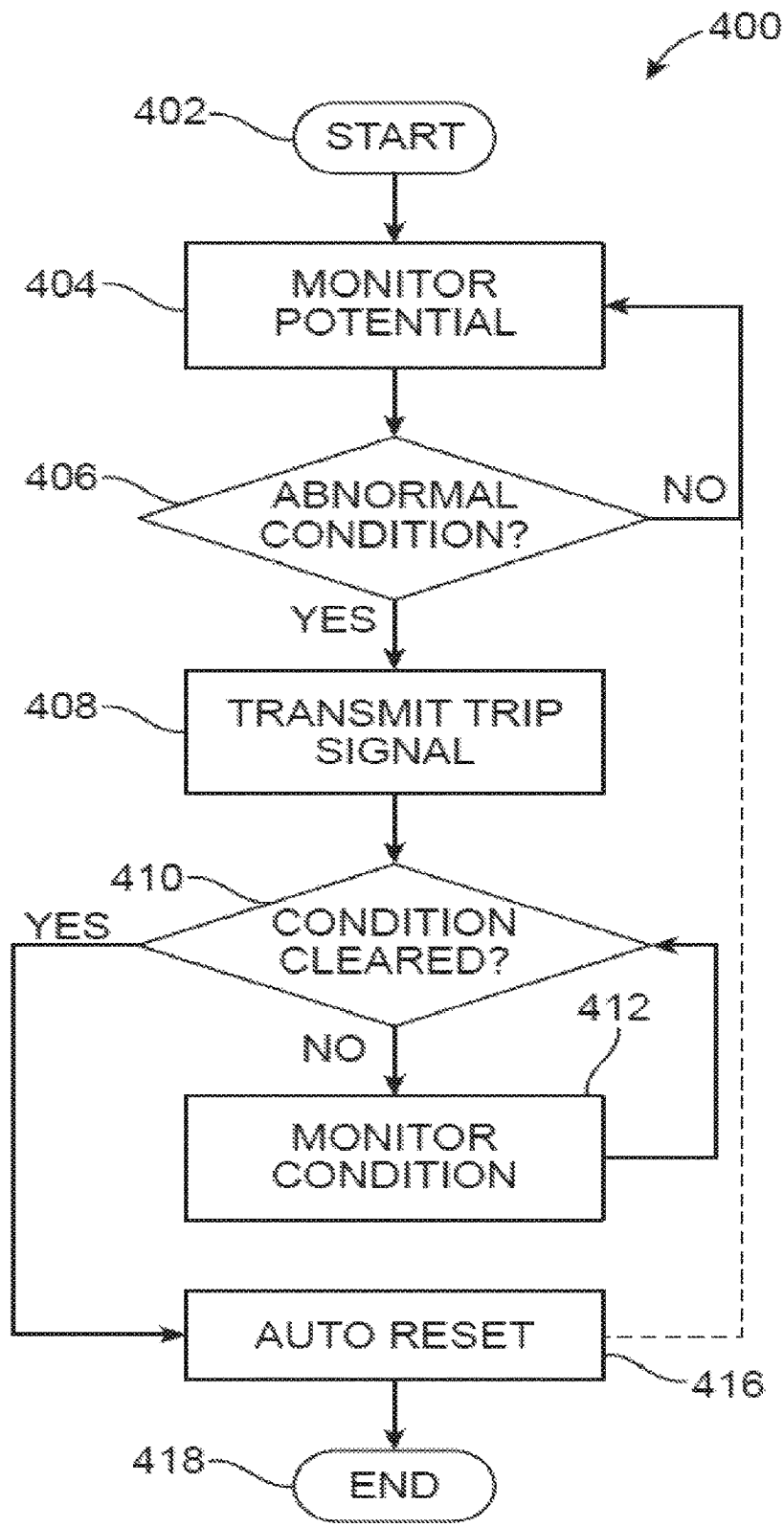
FIG. 4 illustrates another example method using end of line relay devices, according to one or more exemplary implementations.

FIG. 4 illustrates an exemplary implementation of an example methodology 400 disclosed herein. Methodology 400 begins at 402 and proceeds to 404 where a potential is monitored. As in operation 304 of FIG. 3, operation 404 may monitor the potential of one or more phases of a three-phase system. In another exemplary implementation, at 404 an impedance between a pair of phases may be monitored. This monitoring may comprise measuring a potential from a transformer at an end of a distribution line in an electrical distribution network. Measurements may be performed using a sensor.

At 406 a determination is made as to whether an abnormal condition exists in the electrical distribution network. This determination may be made using the monitored potential and/or other sensor information. In exemplary implementations, a utility with which methodology 400 interacts is an electrical source including, directly or indirectly, a three-phase transformer. In exemplary implementations, the abnormal condition may be detection of an abnormality in one or more of the three phases of the transformer. Such an abnormality may include a negative sequence, which may be detected using, e.g., a negative sequence relay device.

If the determination at 406 returns negative, methodology 400 may recycle to 404 where potential continues to be monitored. However, if the determination at 406 returns positive, methodology 400 may proceed to 408 where a trip signal is generated and transmitted. The trip signal may be transmitted to a breaker based on detection of the abnormal condition. The breaker to which the trip signal is transmitted may be up-line from the sensor. The breaker may be a recloser, breaker at a substation, or other breaker in network 200 as is utilized in alternative power distribution networks. In exemplary implementations, the trip signal is configured to cause the breaker to trip open, overriding any closing or reclosing logic or functionality configured therein. In some exemplary implementations, the open conductor is detected by end of line device 270. And the trip signal may be sent to a nearest recloser and/or any other recloser upstream of this device.

After transmitting the trip signal, methodology 400 may proceed to 410 where a determination is made as to whether the condition causing the trip is cleared. Clearing of the trip may be assessed in terms of the total absence of the detected abnormal condition (or any other) or substantial clearance of the abnormal condition (e.g., magnitude, period, or frequency reduce to acceptable levels). However, in exemplary implementations, a second abnormal condition may be detected, such that even if the earlier abnormal condition is cleared, the trip remains due to the presence of an additional abnormal condition. In this manner, the collateral effects of an upstream failure may be addressed during occurrence, as opposed to increasing the risk of improperly energizing a portion of line that is unsafe because the first detected problem appears to have ended.

If the determination at 410 returns negative, methodology 400 may proceed to 412 where the condition is monitored. Monitoring at 412, like other monitoring described herein, may be active or passive. After monitoring at 412, methodology 410 recycles (e.g., continuously, after short periods, at predetermined times, based on other conditions) to 410 where the determination is made as to whether the abnormal condition is clear.

If the determination at 412 returns positive, methodology 400 proceeds to 416 where an auto-reset may occur in at least the end of line device. In exemplary implementations involving a three phase transformer, monitoring at 412 may detect, after transmitting the trip open signal, restoration of the three phases, and normal function of the breaker may resume based on normal function in the three phase transformer. Such normal function may occur based on resetting by the utility after confirming the fault or problem is resolved. In some exemplary implementations, resumption of normal function may be automatic based on action of the end of line relay. For example, end of line device 270 may send a reclose signal to the blocked interruption device responsive to the abnormal condition not being detected anymore or responsive to the abnormal condition being detected to be remedied. The herein disclosed signaling mechanism may therefore be further configured to auto-reset based on detection of normal function in a three-phase transformer.

After 416, methodology 400 may end at 418, or alternatively recycle to 404 (or other operations) to continue providing feedback based on any additional detected abnormal conditions.

While methodologies 300 and 400 are at times described in terms of aspects of the methodologies themselves, it is understood that other elements of the disclosure may be incorporated into accomplishment of methodologies 300 and 400. For example, any structure disclosed herein, or combinations of structures disclosed herein, may be used to carry out the aspects of methodologies 300 and 400 without departing from the scope or spirit of the innovation. Further, where methodologies 300 and/or 400 describe particular structure or system elements for accomplishment of aspects described therein, it is understood that alternatives set forth herein may be utilized for accomplishment of methodologies 300 and 400 (or similar methods).

Figure 5:
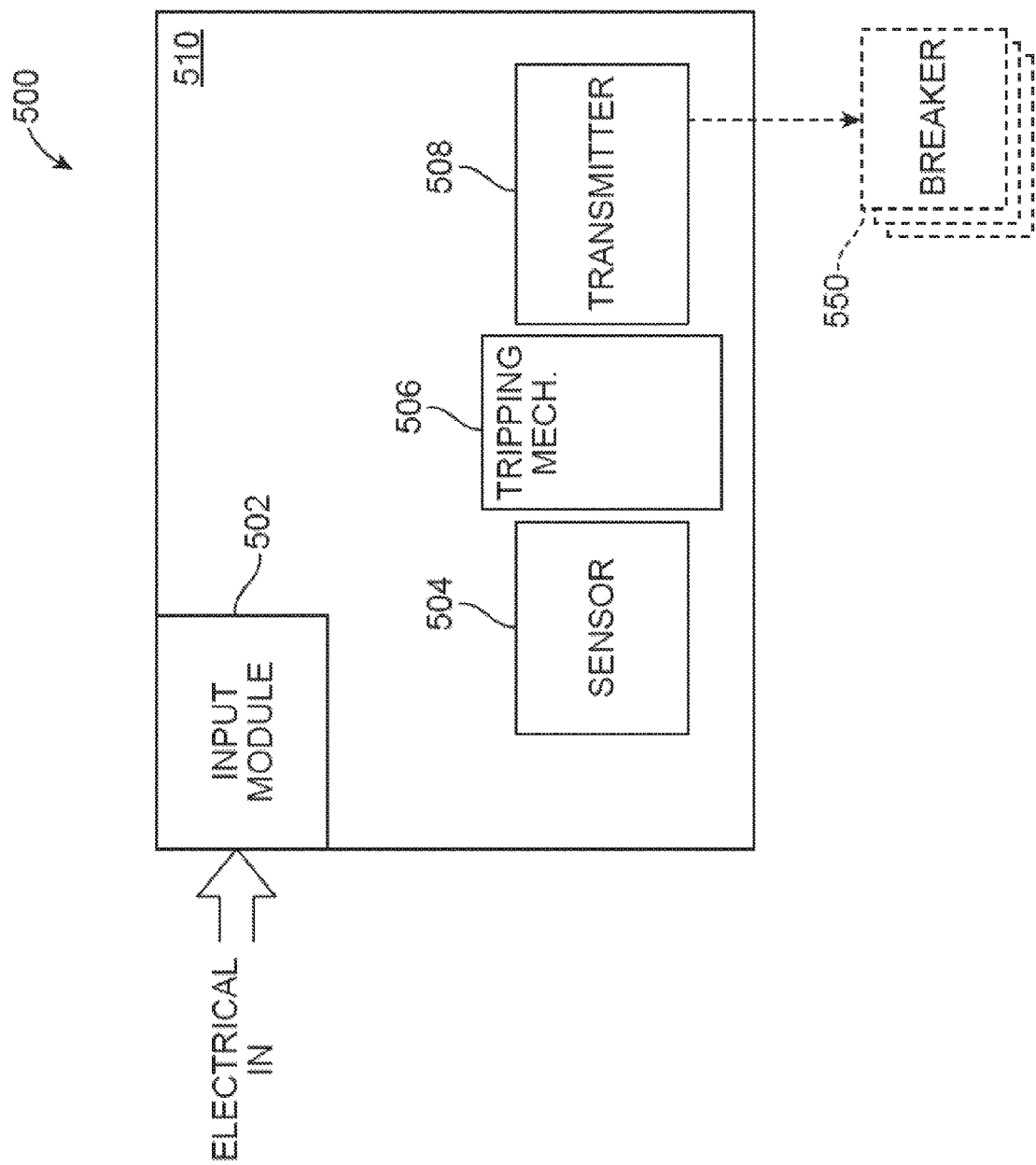
FIG. 5 illustrates a block diagram of an exemplary implementation of an apparatus disclosed herein.

FIG. 5 illustrates a block diagram of an exemplary implementation of a system 500 disclosed herein. System 500 includes an input module 502, a sensor 504, a tripping mechanism 506, and a transmitter 508. These and other components may be housed in a housing 510. In alternative or complementary exemplary implementations, system 500 may be implemented in a distributed manner or as a series of connected components outside a housing.

Input module 502 receives an electrical signal from an electrical utility. The electrical signal may be an electrical output from a transformer or line, or a conditioned electrical signal for use by system 500 (e.g., stepped-down by one or more transformers, suppressed to prevent spikes that could damage system 500 or other safety elements). In exemplary implementations, input module 502 is configured for connection to a service drop from an electrical utility.

Sensor 504 processes the electrical output received by input module 502. Processing may be a one-time, periodic, or continuous process of monitoring. If sensor 504 detects a particular abnormality, the sensor may cause the tripping mechanism 506 to trip. In exemplary implementations not every abnormality need trigger a trip signal. Rather, only certain abnormalities identified by sensor 504 or of sufficient magnitude may trigger tripping mechanism 506. For example, a small, instantaneous voltage sag will not result in a trip signal, but as the magnitude and unbalance of the voltage sag increases, and/or if the voltage sag persists for extended periods of time, tripping mechanism 506 may trip. In some exemplary implementations, tripping mechanism 506 may be a logic board that receives sensor data.

The term voltage unbalance herein refers to a condition in a power distribution system where the root mean squared (RMS) values of the line-to-line voltages or the phase angles between consecutive line voltages are not all equal. The degree of inequality may be expressed as the ratios of the negative and zero sequence components to the positive sequence component. Where RMS voltage phasors are known, unbalance may be calculated precisely using the sequence components. Typically, voltage unbalance is not to exceed 2.5%. Thus, in some exemplary implementations, the abnormal condition may be detected when it exceeds a threshold of 2.5% unbalance. The percent voltage unbalance may be determined using an equation defined by the national electrical manufacturers association (NEMA). This equation may be the maximum deviation from average voltage divided by the average voltage. For example, with line voltage readings of 230 kV, 232 kV, and 225 kV, the average is 229 kV. The maximum deviation from the average among the three readings is 4 kV, and the percent imbalance is 100*4/229=1.7%. In some exemplary implementations, such imbalance would not trigger transmission of a signal to block reclosing of an upstream interrupting device.

A trip signal generated, which may be generated by tripping mechanism 506, may be provided to transmitter 508. Transmitter 508 may provide the trip signal (or another signal provided based thereon) to at least one breaker 550 in a distribution network associated with the electrical utility. In exemplary implementations utilizing a logic board, the logic board (or relay, etc.) may send a signal to transmitter 508 (or another communication module). This signal may be a higher voltage, lower voltage, on switch, off switch, ground trip, non-ground trip, or other signal. The transmitter may provide the trip signal in wired or wireless manners according to the receiving and control capabilities of the breaker(s) (or line reclosers) 550. Transmitter 508 may utilize one or more communication channels based on the capabilities and control of reclosers or breakers in the power distribution network. Examples may include, but are not limited to, wireless communication (WiFi, Bluetooth, etc.), carrier communications channels, telephone circuits, SCADA, fiber optic communication, and others. The signal from the transmitter to the recloser or breaker (or multiples or combinations thereof) may cause it to trip open immediately.

In exemplary implementations, sensor 504 may continue to monitor the electrical output received by input module 502 following a trip signal. If the abnormality is cleared (e.g., abnormality no longer exists, magnitude of abnormality falls below a threshold), tripping mechanism 506 may return to its un-tripped state or reset when the abnormality is cleared. In exemplary implementations, the abnormality being cleared may involve restoration of all three phases to the three phase transformer. Thereafter, reclosers may be permitted to reclose or otherwise resume normal function, and power may be restored on branches that were previously deenergized in an open circuit configuration due to the abnormality.

In exemplary implementations, system 500 may include local or remote override capability. In some such exemplary implementations, transmitter 508 may be a transceiver configured to accept a control signal that enables or disables system 500. Alternatively, a local electronic, electrical, or mechanical interface may be provided (e.g., button, switch) to manually enable or disable system 500. When system 500 is disabled, it remains in-service and functional but permits reclosers, breakers, or other elements to operate normally. In exemplary implementations, system 500 may be enabled when fault risk increases (e.g., hot, dry weather involving fire hazards; windy weather likely to move lines or break tree branches; cold, wet weather where ice may accumulate on lines or circuit elements) but disabled when fault risk decreases (e.g., typical environmental conditions where restoring power rapidly with reclosers is reasonable).

Housing 510 may, in exemplary implementations, be a weatherproof housing including weatherproof apertures or conduits for one or more of electrically and/or mechanically coupled to housing 110 and/or components therein to an electrical utility. Housing 110 may be securable, including locks, latches, hardware, or other means for closing housing 110. In exemplary implementations, housing 110 may be opened, via at least one door with a movable (e.g., hinged) or removable (e.g., entire panel removable) connection to allow access to components therein. In exemplary implementations, housing 110 may be a NEMA rated box (e.g., a 3R rated box, a 3S rated box, or compliant with other box ratings).

While system 500 shows several elements as distinct, it is understood that two or more elements may be combined without departing from the scope or spirit of the innovation. For example, input module 502 and sensor 504 may be combined, with the electrical utility connected directly to sensor 504 or subcomponents thereof. In an alternative or complementary example, sensor 504 may include or be tripping mechanism 506. In an alternative or complementary example, tripping mechanism 506 may include or be a part of transmitter 508. Further, aspects illustrated singularly may represent two or more elements. For example, sensor 504 may represent two or more sensors, such as a voltage differential sensor or amperage differential sensor. Where multiple sensors are included, data collected or developed by each sensor may be independently interrogated to monitor for faults, or multi-sensor data may be utilized and compared to increase the confidence in fault detection through corroboration and ensure one malfunctioning sensor does not bring down a large section of a power distribution network.

Figure 6:
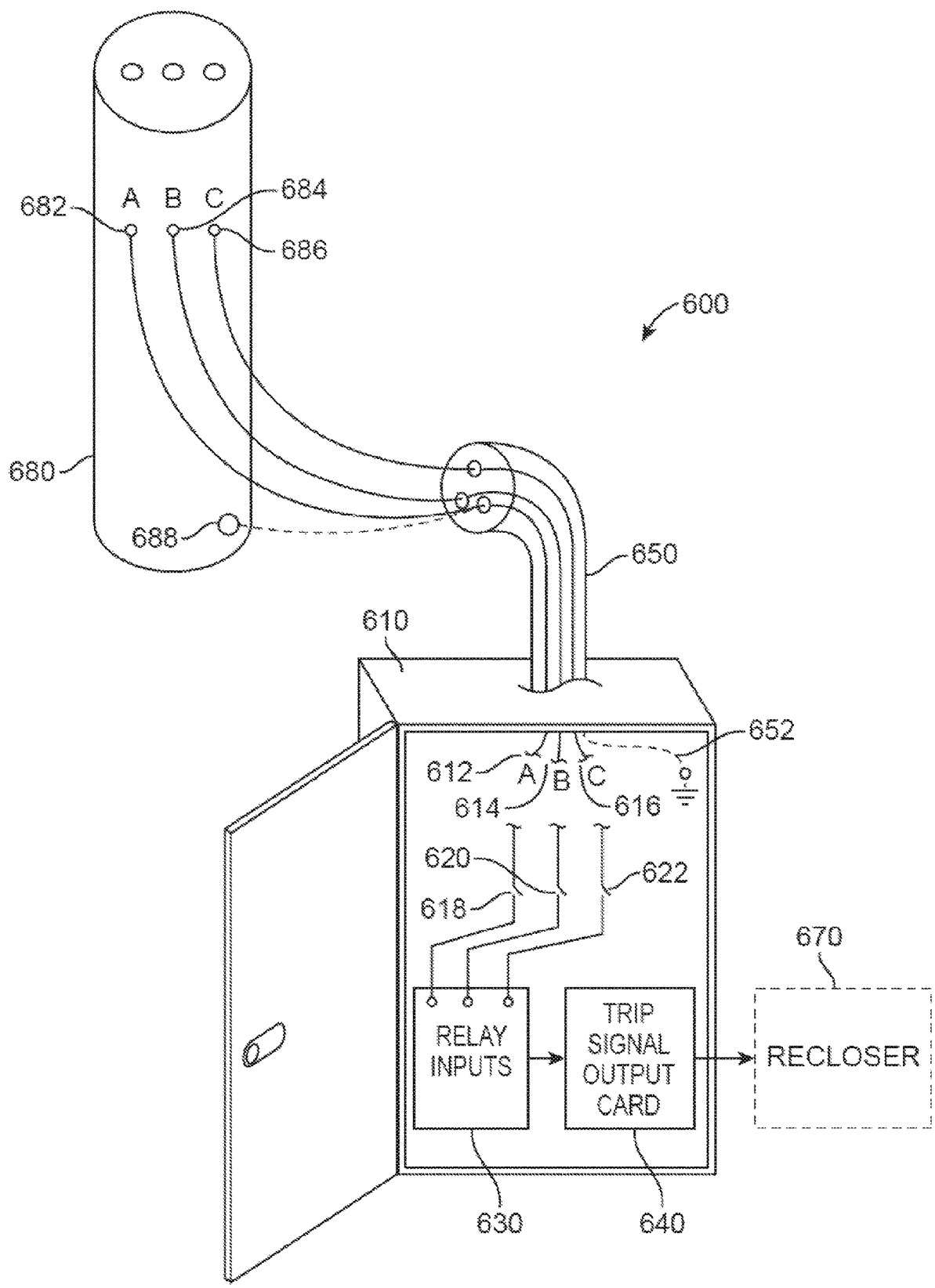
FIG. 6 illustrates an exemplary implementation of a system disclosed herein.

FIG. 6 illustrates an exemplary implementation of a system 600 including an end of line fault protection device contained in housing 610. Housing 610 may be a cabinet. The end of line open conductor (fault) protection device is electrically coupled to transformer 680, which may be, e.g. a pole-top 3-phase 12 kV or 21 kV transformer. Transformer 680 includes three secondary connections, 682, 684, and 686, which may be three-phase at 120 Volts per phase. In exemplary implementations, transformer 680 may also include a ground 688. Connection to secondary connections 682, 684, and 686, and in exemplary implementations ground 688, may define a service drop 650 electrically connecting the fault protection device with the transformer. The fault protection device may be configured to be installed at the end of a distribution line in an electrical distribution network.

Service drop 650 provides conductors 612, 614, and 616, one for connecting to each phase, and in some exemplary implementations ground 652, connect to one or more sensors. In exemplary implementations, a sensor may be provided for each phase, with sensor 618 corresponding to conductor 612, sensor 620 corresponding to conductor 614, and sensor 622 corresponding to conductor 616. Sensors 618, 620, and 622 may be configured to detect faults or abnormalities from electricity received via service drop 650.

Housing 610 may also contain tripping mechanism 630. Tripping mechanism 630 may be in electrical communication with sensors 618, 620, and 622, and it may receive an output from the sensors. Tripping mechanism 630 may be configured to detect an abnormal condition based on the by-phase output of the sensors 618, 620, and 622 and trip in response to the abnormal condition. In alternative or complementary arrangements, sensors 618, 620, and 622 may detect and indicate the abnormal condition, and tripping mechanism 630 may trip in response to one or more of sensors 618, 620, and 622 indicating an abnormal condition in one or more of their associated phases. In exemplary implementations, the abnormal condition may be a negative sequence caused by potential loss on one or more of the three phases. In some such exemplary implementations, tripping mechanism 630 and/or sensors 618, 620, and 622 may include a negative sequence relay device. In exemplary implementations, a negative sequence voltage may be detected by the sensors with an indication of the negative sequence voltage provided to a relay.

Tripping mechanism 630, and/or sensors 618, 620, and 622, may also be configured to determine when an abnormal condition ceases. In an exemplary implementation, tripping mechanism 630 and/or sensors 618, 620, and 622 may be further configured to detect, after detecting the negative sequence, restoration of the three phases. Tripping mechanism 630 may include logic for determining an abnormal condition based on sensor inputs or electrical characteristics. Alternatively or complementarily tripping mechanism 630 may include electrical and/or mechanical components configured to trip in response to particular sensor outputs or electrical characteristics.

Within housing 610, signaling mechanism 640 may determine the tripping or may receive an output from trigger mechanism. This mechanism may be configured to transmit a trip signal to circuit breaker or recloser 670 (also referred to as a fault interrupting switch) based on detection of the abnormal condition, wherein breaker 670 is upstream of the sensor. The trip signal may be configured to cause breaker 670 to trip open. As a relay, the timing for signaling mechanism 640 (and/or tripping mechanism 630) may be set for instantaneous or short time delay action, thereby facilitating real-time tripping and tripping open of affected elements.

Signaling mechanism 640 may further be configured to transmit a clear signal to a breaker based on detection of normal function in the three phase transformer, or auto-reset where restored. For example, a clear signal may be provided when all three phases are restored to normal operation.

In exemplary implementations, one or more batteries may also be contained in housing 610 or components thereof. If an interruption to power from service drop 650 occurs, the batteries may ensure the function of the apparatus and allow lockout of upstream breakers until power is restored via service drop 650.

Figure 7:
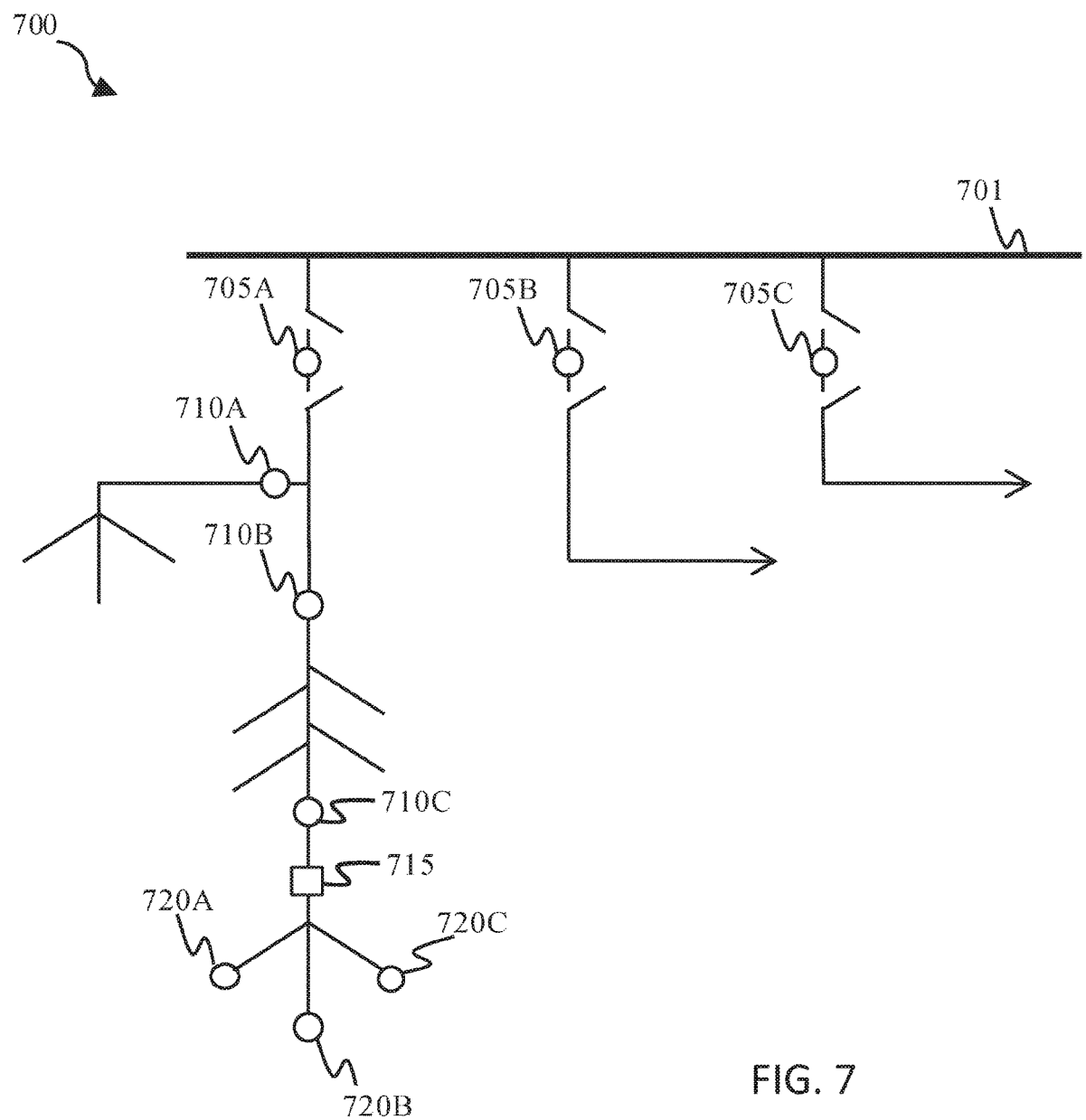
FIG. 7 illustrates distribution circuits in a topology employing radio communication between end-of-line devices and other elements, according to one or more exemplary implementations.

FIG. 7 illustrates an example of a three-phase diagram of a distribution circuit, including aspects disclosed herein. In FIG. 7, a distribution bus is illustrated at the top with three distribution circuit breakers and with three distribution (e.g., 12 kV) circuits. Downstream from interrupting device 710C the three-phase circuit is divided out into an environment such as a rural area (or end of line connections in the circuit). A single phase voltage potential may be taken from phase A, phase B, and/or phase C, and a signal may be transmitted (e.g., sent via a radio signal or other techniques disclosed herein) from the end of that line through or around relay 715. If a negative sequence voltage relay senses a severed conductor condition it will send a trip signal to interrupting device 710A, 710B, or 710C.

FIG. 7 thus illustrates a simplified three-phase drawing of a distribution network/circuit. This figure depicts three distribution circuit breakers 705A, 705B, and 705B that are each connected via a branch to a same distribution bus 701. In the left-most branch, there are three line reclosers 710A, 710B, and 710C. Each of these reclosers may be the same or different. End of line device 715 may be installed substantially at an end of a distribution line, e.g., in a remote area. At the end of each phase, there may be relay transmitter 508 (e.g., a radio) that transmits a signal to an upstream interrupting device. In the example of FIG. 7, there is depicted transmitter 720A for phase A, transmitter 720B for phase B, and transmitter 720C for phase C. In some exemplary implementations, a radio may thus be used by a voltage unbalance detection device (and via the continuity testing technique described further, below) to signal back information regarding the fault (e.g., an open conductor) to an upstream interrupting device. This radio may be set up to have a suitable line of sight.

In some exemplary implementations, end of line device 715 and transmitters 720 may form end of line device 270. In some exemplary implementations, the trip signal may be transmitted by an end of line device (e.g., device 270 of FIG. 2, device 1230 of FIG. 12, or any one of devices 720A, 720B, and 720C) without use of a positive sequence power source.

Figure 8A:
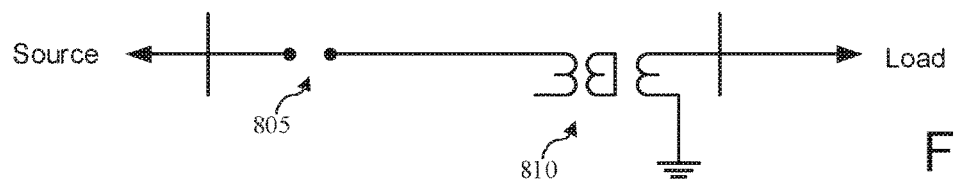
FIGS. 8A and 8B are simplified single-line and multi-line diagrams of a power circuit reflecting an open conductor, according to one or more exemplary implementations.
Figure 8B:
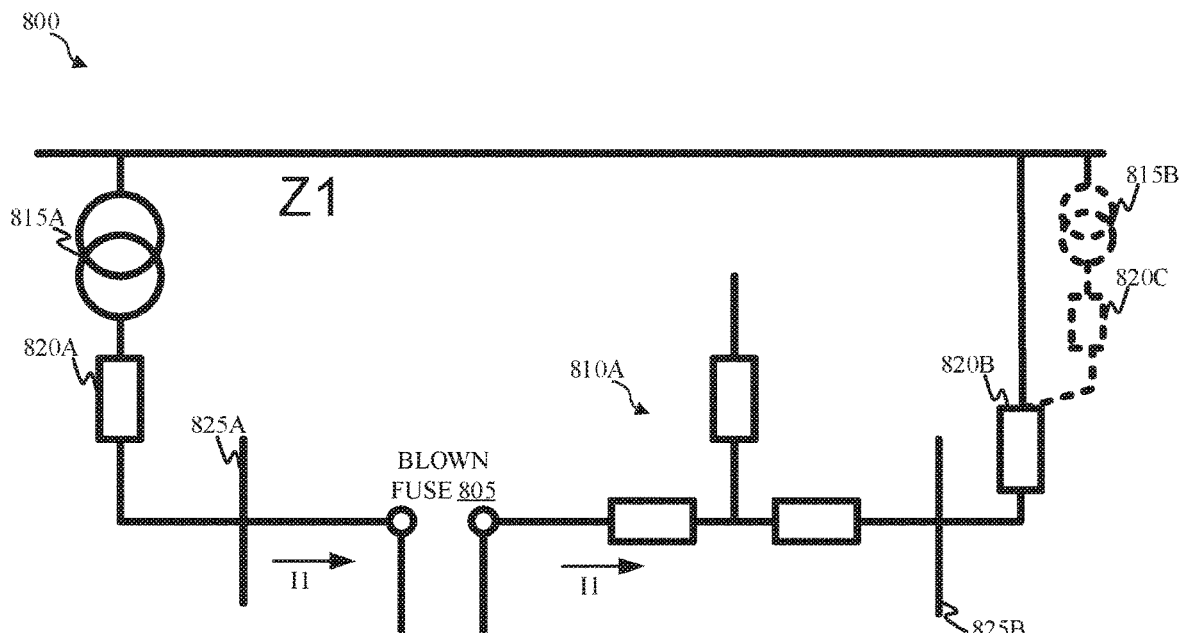

FIGS. 8A-8B depict network connection 800 of symmetrical components and detection of a broken conductor at an end of line device. FIG. 8A is a simplified diagram of FIG. 8B, which includes circuits Z1 (positive sequence), Z2 (negative sequence), and Z0 (zero sequence), respectively, for the three different phases. FIGS. 8A-8B depict an open conductor scenario upstream of a transformer.

Power source 815B, depicted in FIG. 8B, may be a weak, renewable source that may be optionally added into the power system. For example, in implementations where there is a weak source on the secondary side, source 815B and source impedance 820C may be added to an appropriate sequence network. FIGS. 8A-8B further depict distribution busses 825A, 825B, 825C, 825D, 825E, and 825F. FIGS. 8A-8B further depict transformer banks 810A, 810B, and 810C. In some exemplary implementations, fuse 805 on one of the phases may be blown, which emulates an open conductor or a series fault due to an unbalanced system/load. In FIGS. 8A-8B, there is no shunt fault (i.e., a single line to ground fault, a line-to-line fault, or a three-phase fault). In some exemplary implementations, transformer 810 may have its high side neutral winding lifted. Loads 820A, 820D, and 820F, which are depicted in FIG. 8B, may each be a high tension system impedance. Load 820B and 820E, also depicted in this figure, may each be an equivalent load impedance. As depicted within circuit Z2 of FIG. 8B, voltage V2 is where a negative sequence voltage may be measured by the end of line device. That is, a voltage source location may be measured with respect to bus 825D and the phase associated with circuit Z2. When there is a high side neutral winding lifted, the disclosed end of line device may still use the negative sequence power to measure voltage V2. FIG. 8B further depicts current flows I1 and I2.

Figure 9:
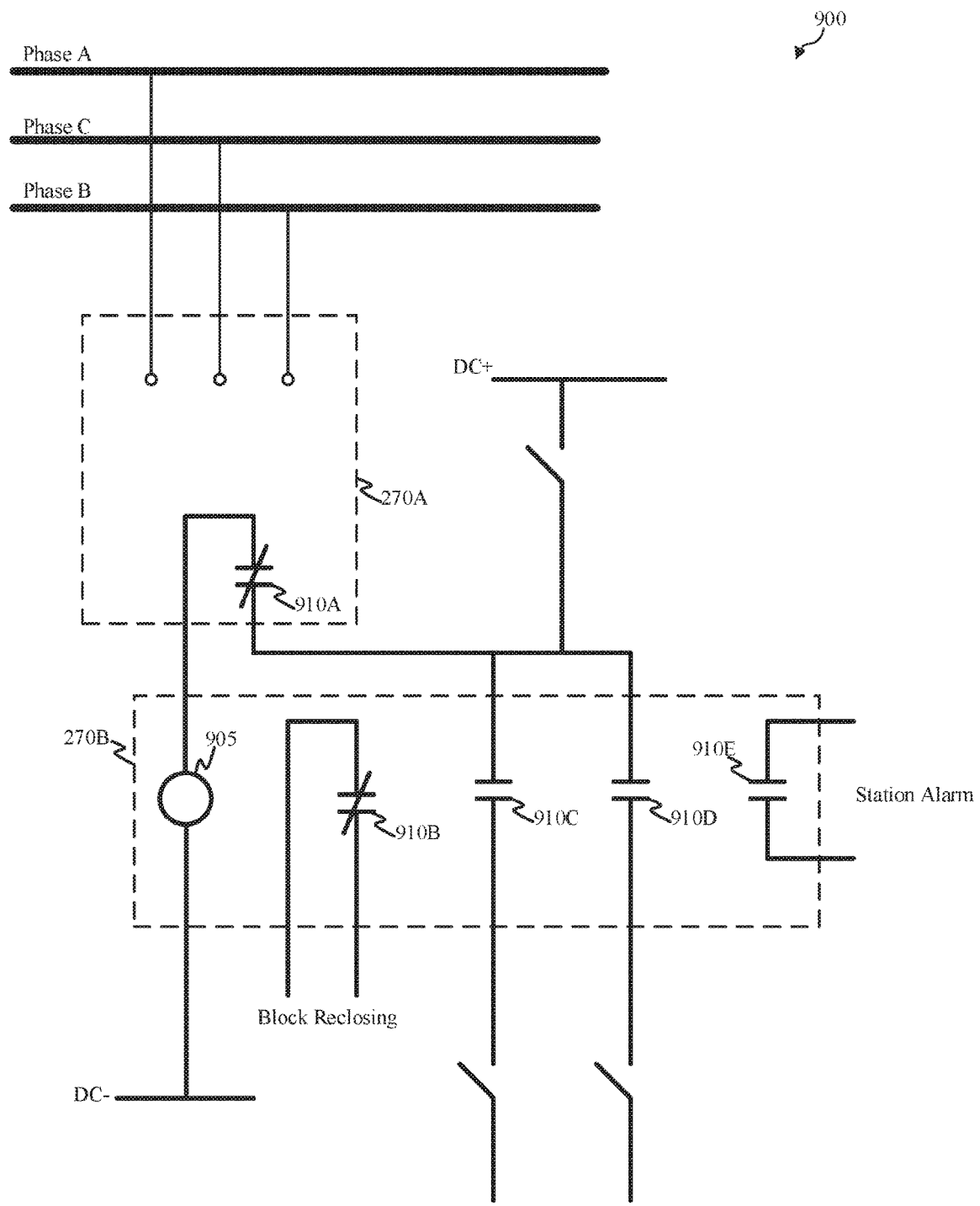
FIG. 9 illustrates an arrangement implementing an end-of-line detection component, according to one or more exemplary implementations.

FIG. 9 depicts example application 900 of the disclosed voltage unbalance detection protection. Device 270A, depicted in this figure, may be a numerical relay or a microprocessor relay, and it may be located, e.g., where device 1230 is located in FIG. 12. Device 270B may implement a timer. This timer may or may not be part of device 270A.

Device 270A may implement the disclosed voltage unbalance detection technique by measuring voltage magnitudes and deriving relative phase angles between the three phases A, B, and C, which are referenced to the power system source. Phase angles between the phases may be measured and compared locally within this voltage unbalance device, prior to the open conductor condition. The phase angle may be affected by a topology of the system and by a type of load connected at the distribution feeder downstream from the voltage unbalance monitoring location. Phase angle measurements may be compared to measurements from devices monitoring adjacent circuits (e.g., conductors). Device 270A may implement voltage angle measurement over a wide area. That is, this device may be located anywhere within distribution network 200. This measurement may be performed with suitable time synchronization and with a communication interface.

In some exemplary implementations, end of line device 270A is a device that monitors each of phases A, B, and C. In some exemplary implementations, end of line device 270A and end of line device 270B may form end of line device 270 (e.g. in a same packaging). In other exemplary implementations, devices 270A and 270B may be separate from each other. At a timeout of the timer of device 270B, an alarm may be asserted. In some exemplary implementations, the alarm may notify an operator of the problem.

The timer of device 270B of FIG. 9 may be user-settable for specifying operation of the contacts, i.e., after the set time delay times out. Since the problem may be anywhere (e.g., there may be a line to line fault between phases B and C at bus 1205A of FIG. 12), the timer may provide flexibility or selectivity to identify or differentiate where the problem is to prevent over-trip and to avoid being too sensitive (e.g., causing an interrupting device from tripping open unintentionally). For example, unlike an open phase broken conductor scenario, there may be a bus fault (e.g., at bus 1205A). But this fault may be instantaneously cleared, thus effectively utilizing the coordinated timing configured with respect to device 270B. For example, in scenarios where a phase-to-phase fault exists on an upstream bus (e.g., bus 1205A of FIG. 12), the timer of device 270B may be configured to expect protection on this bus to be instantaneous. That is, the upstream bus protection may trip before device 270A operates so the timer of device 270B may slow down device 270A such that the upstream bus protection is given opportunity to operate first. If the problem clears, then device 270A may not operate.

A phase-to-phase fault may generate a sufficient negative sequence to be considered a voltage unbalance. However, the mentioned local bus protection may trip first, and then device 270A may reset (i.e., before timing out), which is contemplated as coordinated timing. The timer of device 270B thus protects the disclosed protection system from operating incorrectly. In some exemplary implementations, device 270A may comprise electrical contact 910A. In FIG. 9, contact 910A is depicted as a normally closed contact. In some exemplary implementations, device timer 270B may comprise measurement element or sensor 905. In some exemplary implementations, device timer 270B may further comprise dry contacts 910. For example, device timer 270B may comprise contacts 910B, 910C, 910D, and 910E. In FIG. 9, contact 910B is depicted as a normally closed contact, and contacts 910C, 910D, and 910E are depicted as normally open contacts. Contacts 910 may be closed to stop an upstream interrupting device from reclosing. Upstream of contacts 910C and 910D may be trip feeders (e.g., with respect to interrupting device 1210 of FIG. 12).

Device 270A may implement voltage unbalance detection by monitoring a negative phase sequence and/or by determining an abnormal condition based on inequality (e.g., any inequality, inequality within a threshold of angle magnitude, inequality sustained for a threshold period of time, etc.). For example, device 270A may measure relative phase angles and compare them to determine an abnormal condition. This device may measure voltage magnitudes and derive relative phase angles between the three phases, referenced to power system source. These measurements may be taken at a transformer or any other location in a power network. The phase angles between phases may be compared to one another, locally within the voltage unbalance device, with the condition prior to open conductor. If the phase angles are not equal (or deviate by a threshold amount, or remain in a deviated state for longer than a threshold amount of time), an abnormal condition may be detected. The voltage unbalance detection device may then communicate the abnormal condition up line to lock open reclosers, send notifications, or interact with a power substation or source.

If the generator phase currents are equal and displaced by exactly 120°, only positive-sequence current will exist. A current or voltage unbalance between phases in magnitude or phase angle may give rise, though, to negative and zero-sequence components. Phase angle may be affected by topology of the system and/or by a type of load connected at the distribution feeder downstream from a location where monitoring occurs for unbalanced phases, for example, independent of whether it is a wye or delta connected load. But the disclosed techniques are agnostic to such topological variables.

Phase angle measurements may be compared to measurements from devices monitoring adjacent circuits (conductors). By way of analogy, this enables a system in which neighbors may look out for other neighbors. In this manner, open conductors may be located and isolated (e.g., by determining that one device reports an open conductor and an adjacent device does not), and the presence of an open conductor may be confirmed (e.g., more than one location in the same electrical series reporting an abnormal condition to avoid a false positive).

Implementation of voltage angle as a wide-area measurement is also possible with proper time synchronization and communication interface. The phase is necessarily dependent on time, and so the differences in propagation times and electrical network topology location must be accounted to identify corresponding phases to compare. Using time coordination and location awareness (e.g., GPS location), angle differences may be compensated to implement wide-area measurement and comparison, thereby broadening the neighbors-watching-neighbors analogy.

Figure 10A:
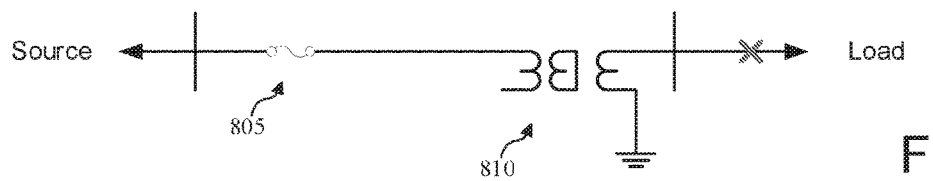
FIGS. 10A and 10B are simplified single-line and multi-line diagrams of a power circuit reflecting a load fault, according to one or more exemplary implementations.
Figure 10B:
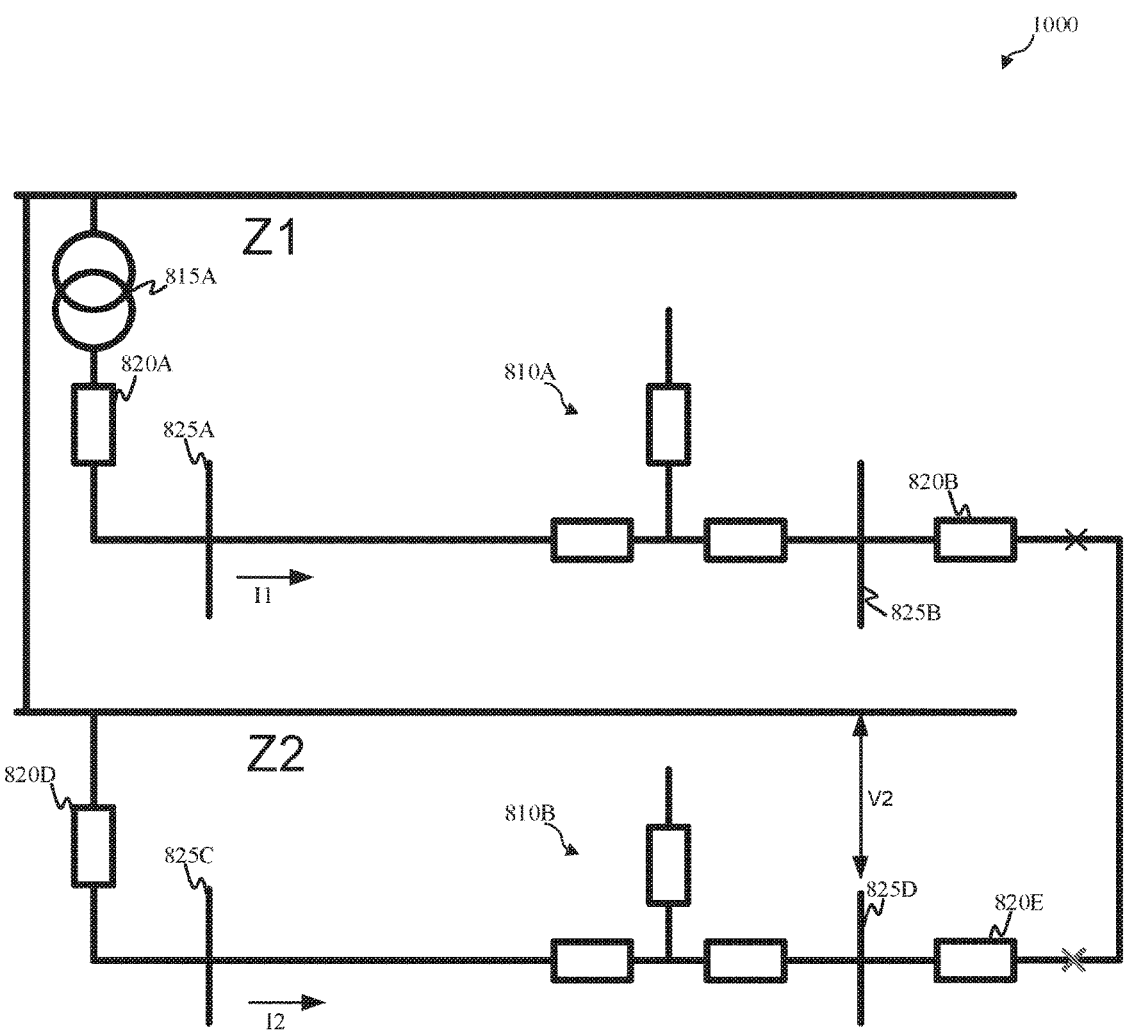

FIG. 10A depicts a simplified version of the multi-phase circuits depicted in FIG. 10B. These two figures show a phase-to-phase fault at a load. The fault is depicted by an X. Load 820B may be a line impedance to the fault. In the sequence diagram of FIG. 10B, power source 815A may be the main source from a power utility company. The circuit Z1 may include a positive sequence component, and circuit Z2 may include a negative sequence component. Transformer 810A or 810B may be the same as the one with the high side neutral winding lifted.

Figure 8B:
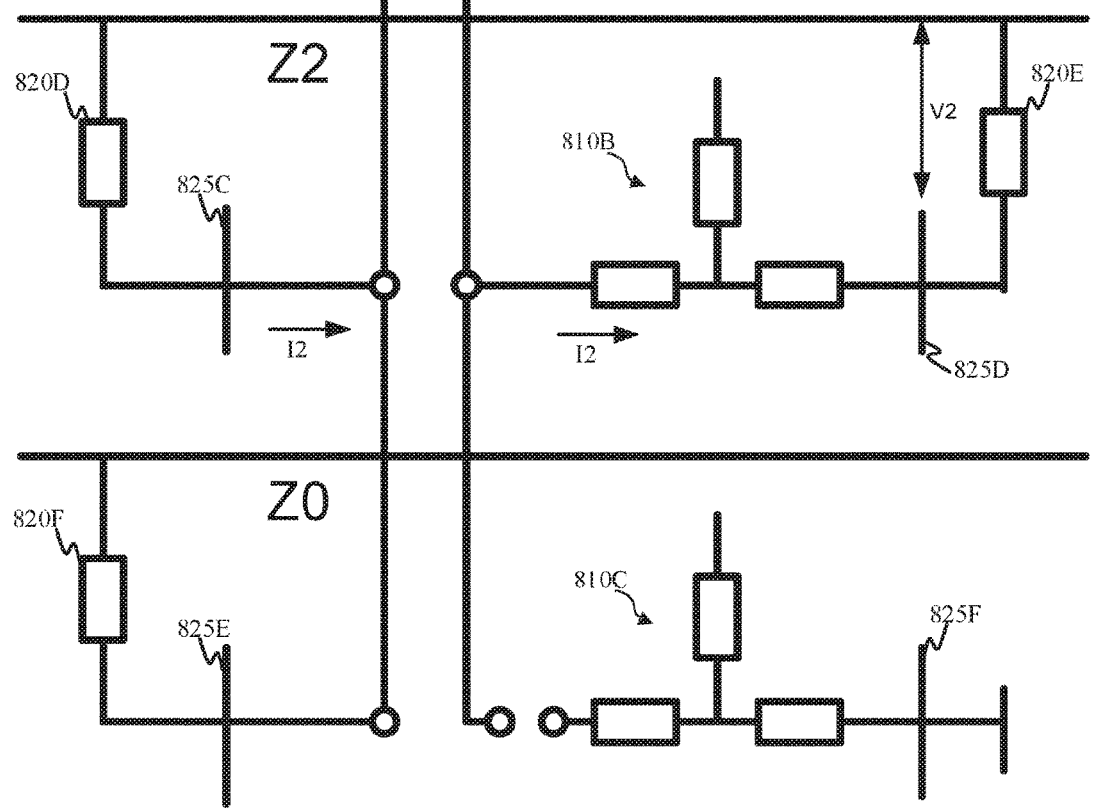
Figure 11A:
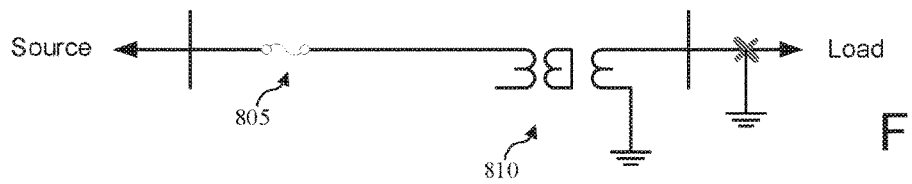
FIGS. 11A and 11B are simplified single-line and multi-line diagrams of a power circuit reflecting another load fault, according to one or more exemplary implementations.
Figure 11B:
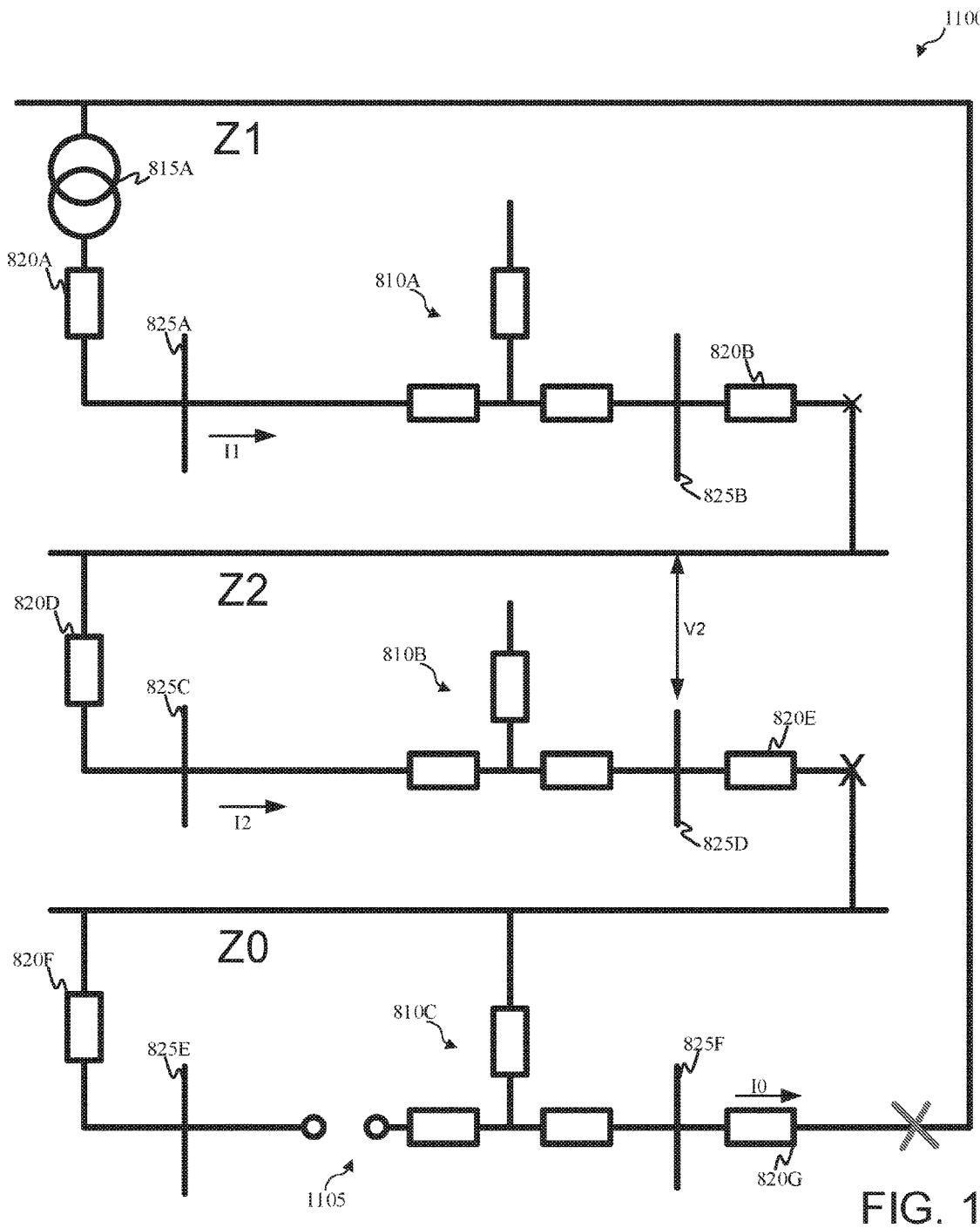

FIGS. 11A-11B, which have similar or same components as FIGS. 8 and 10, depict a phase to ground fault. For example, element 1105 of FIG. 11B may be a high tension neutral wire that is ungrounded.

FIG. 12 depicts a single line diagram of a power system, including multiple distribution circuits. Although the depiction of FIG. 12 does not show all three phases, a system with all three phases is contemplated for carrying out exemplary implementations. Busses 1205A, 1205B, 1205C, 1205D, 1205E, 1205F, and 1205G may be busses or busbars. A bus or busbar is an electric node where multiple high-voltage components are connected. The voltages of the phases of bus 1205A may be at 12 kV, e.g., transformed down by transformer 1225A from 115 kV. Devices 1210A, 1210B, 1210C, and 1210D may be interrupting devices (e.g., GE VIB-15.5-12000 circuit breakers or a recloser). Devices 1215A, 1215B, 1215C, and 1215D may be overcurrent protectors (e.g., a SEL-351 or SEL-351A protection system). Devices 1220 (i.e., 1220A, 1220B, 1220C, and 1220D) may be relays. Devices 1225A, 1225B, 1225C, 1225D, and 1225E may be transformers. For example, 1225A may be a 115/12.47 kV transformer, and each of 1225B, 1225C, 1225D, and 1225E may be a 12.47/0.21 kV transformer. But these values and devices are not intended to be limiting, as any suitable device may be installed at that location and have any suitable value, or system 1200 may altogether have a different configuration of branches and busses.

In some exemplary implementations, load 2 connected to bus 1205H may not be connected (e.g., due to a breaker being open). Loads 1 and/or 2 may be of the same or different type. For example, each of loads 1 and 2 may be delta configured or star (wye) connected. End of line measurement device 1230 is depicted at Load 1, but this is not intended to be limiting, as this measurement device may be located at any location downstream of the power source. In this or other exemplary implementations, multiple measurement devices 1230 may be installed at various locations throughout exemplary system 1200. For example, measurement device 1230 may be located at or near bus 1205E, at or near bus 1205D, at or near transformer 1225C, at or near bus 1205I, at or near transformer 1225E, and/or at or near bus 1205J. Measurement device 1230 may look back upstream and detect a voltage unbalance abnormality anywhere upstream, including up to and including a substation (not shown in FIG. 12) associated with the power source.

In some exemplary implementations, measurement device 1230 may be the same as end of line device 270. Measurement device 1230 or end of line device 270 may be able to detect, in one example, an open conductor condition (e.g., of phase A), with respect to one or more of the phases, at a location between busses 1205C and 1205D. A receiver at or near interrupting device 1210B may receive a trip signal transmitted by an end of line device to at least temporarily block reclosing. In another example, if there were an open conductor condition on a phase between busses 1205A and 1205H, measurement device 1230 or end of line device 270 may detect this condition and transmit a signal to interrupting device 1210D to at least temporarily block interrupting device 1210D from reclosing a circuit. In some exemplary implementations, the power source may be power plant 210, tower 216, transmission substation 220, tower 224, distribution substation 226, or a utility company transmission grid. This power source may be associated with a power utility company.

At any location of system 1200 there may be a monitoring element or a measurement point (e.g., a relay, meter, etc.). At these points, a device may analyze sequence components, phase angles, and otherwise measure voltage and current.

Figure 13:
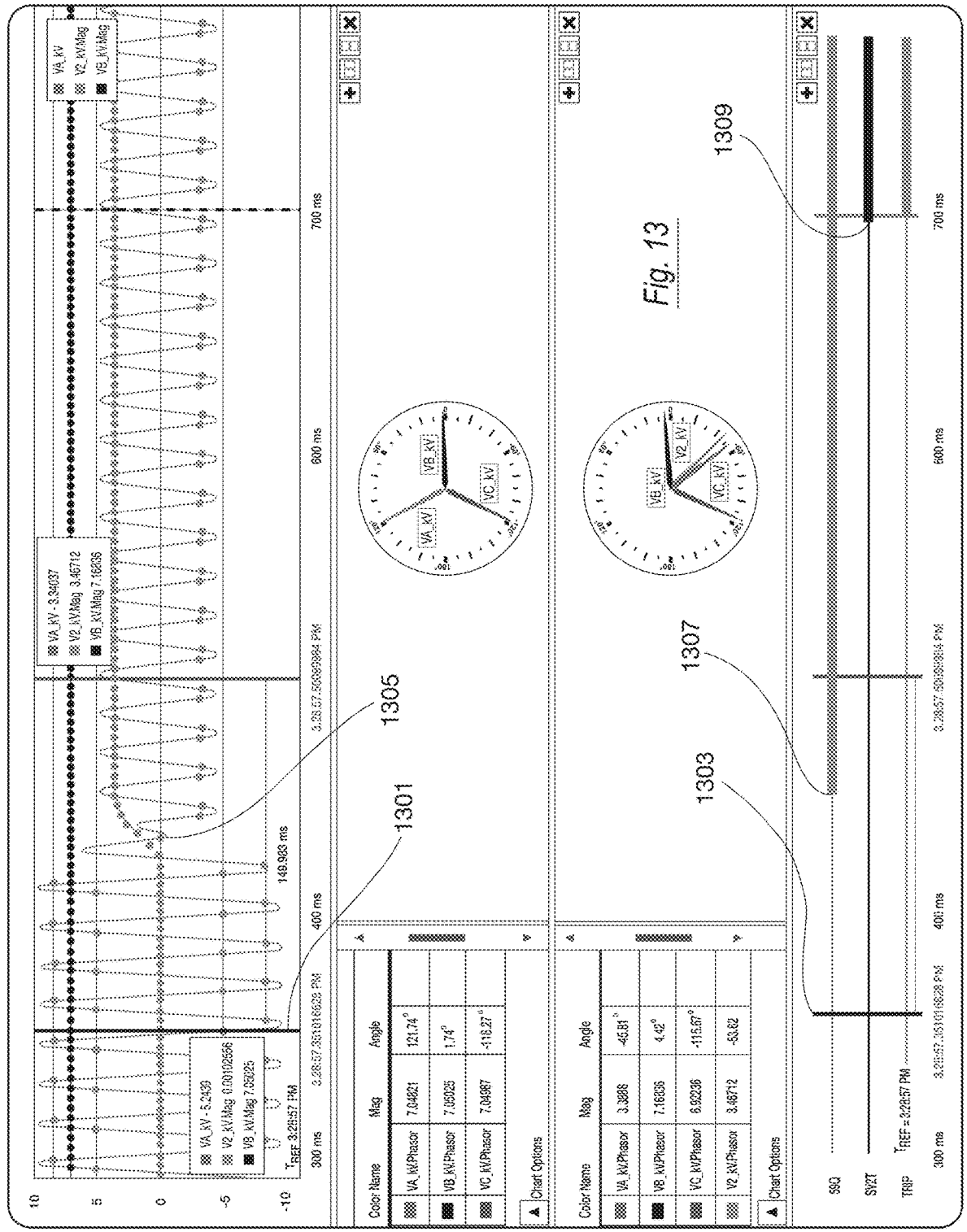
FIG. 13 illustrates exemplary analysis of a normal configuration and of a subsequent, abnormal condition, according to one or more exemplary implementations.

FIG. 13 depicts an exemplary scenario of an open conductor, e.g., between busses 1205C and 1205D. In this example, the voltage unbalance is set at a threshold of 30 volts. And, after a 250 milliseconds (ms) delay, an end of line device may cause triggering of a station alarm. At the bottom left of FIG. 13, i.e., at about the 350 ms mark, is depicted initial conditions of a three-phase normal, balanced system. That is, at this time, there is no abnormal negative sequence voltage magnitude and no abnormal negative sequence voltage angle. At approximately the 440 ms mark, an end of line device may detect a negative sequence overvoltage (e.g., by a relay 47N/59Q). But, since this approach may be complemented by a configurable timer, a trip signal may not yet be energized. Approximately 250 ms after this detection, the timer may timeout. And then just a few milliseconds after that, a trip condition signal may be sent to an upstream interrupting device to open and block reclosing. In some exemplary implementations, the voltage magnitude and associated angle may remain steady at the end of line detection device while the configurable timer is timing. At the top of FIG. 13, the plotted dots may be measured points, and the sinusoidal curve may be made via curve fitting. The V2 Mag may be the RMS voltage of the negative sequence triggered by an open conductor (e.g., 3.467 kV).

FIG. 14 depicts a flow chart of independent methods for added security. That is, the alternative paths that may be taken (i.e., to the left and right of the middle path that includes operations 1404 and 1410) may be used to confirm whether a problem exists. For example, they each independently may confirm that an open conductor exists. FIG. 14 thus depicts alternate or complementary open conductor detection techniques. For example, as a result of operation 1408, one or more phases may be detected as de-energized due to an absence of an expected KHz-GHz over power line signal. As a result of operation 1410, a signal may be transmitted by an end of line device to block a trip signal due to a blown fuse or an open conductor. Resulting from one or more of these techniques, an upstream interrupting device may be opened and thus a reclosing operation may be blocked.

Operations 1404 and 1410 may be optional. For example, in addition to or instead of the voltage unbalance monitoring, a signal carrier may be applied to a power line to detect an abnormal condition (e.g., an open conductor) based on a loss of a signal carrier (e.g., a communication signal) over power line. That is, each of the phases may be equipped with the signal carrier over power line monitoring and be set-up with sufficient frequency diversity from other remaining phases. Coupling to the high voltage circuit may be facilitated via a high voltage bandpass filter. A high frequency signal (e.g., in KHz, MHz, or GHz bands) may be continually transmitted between each of the conductor phase transmitter and receiver locations, in operation 1402. This communication link may be unidirectional or bidirectional, and it may be a broadband link. In some exemplary implementations, the transmitter may be located at or near an upstream interrupting device, and the receiver may be located at or near the end of the power line. In other exemplary implementations, the transmitter may be located at or near the end of the power line, and the receiver may be located at or near the upstream interrupting device. Depending on the conductor length (e.g., between the EOL monitoring location and the recloser) and/or network topology (e.g., having one or more transformers in the middle of the power distribution network that may be bypassed), one or more signal repeaters may be added to repeat the high-frequency monitoring signal. When an open conductor occurs at one of the phases, one of the high frequency signals would fail to be received, as depicted in operation 1408. In some exemplary implementations, a carrier signal over the power line may enable security for a voltage unbalance caused by a blown fuse on the secondary side of an instrument transformer versus a true open conductor, for cases when the instrument transformer is fused.

In some exemplary implementations, operation 1402 of FIG. 14 may comprise communicating three signal carriers through a power network. Each of these three signal carriers may respectively be associated with a phase of three-phase power in the power network, and the signal carriers may possess frequency diversity between the three phases to minimize signal related interferences. These signal carriers may be of much higher range (e.g., between hundreds of Hz and a few GHz) in comparison with a power frequency of the three-phase power. In some exemplary implementations, operation 1408 may comprise determining whether an abnormal condition in the power circuit exists based on an interruption to one or more of the three signal carriers.

Carrier signals over power lines may be referred to, in exemplary implementations, as broadband, in contrast with radio techniques disclosed herein that may be lower bandwidth, point-to-point, and over-the-air. A signal carrier over power line may thus be applied to detect an open conductor. A signal carrier (e.g., continuous or periodic communication) over power line may be used as a primary way or as a backup approach to other open conductor detection techniques. This technique may be applied for added security (e.g., as proof against false positives). When an open conductor occurs on one of the phases, a broadband signal being communicated over that line is interrupted. End of line devices or other devices may be configured to interpret this signal interruption as an open conductor or other abnormal condition. Each of the three phases may thus be associated with a signal carrier over power line monitoring. The signal carrier provides sufficient frequency diversity from the frequencies of the phases; the frequency associated with the power (e.g., 60 Hz) does not interfere with, and is not interfered with by, the frequency associated with the signal carrier. While particular frequency ranges are provided, it is understood that any frequency range (low frequency, high frequency, very high frequency, ultra-high frequency, etc.) may be utilized without departing from the scope or spirit of the innovation. In exemplary implementations, elements providing or receiving signal carriers may be arranged upstream of fuses to allow for discrimination between blown fuses and down lines.

Figure 15:
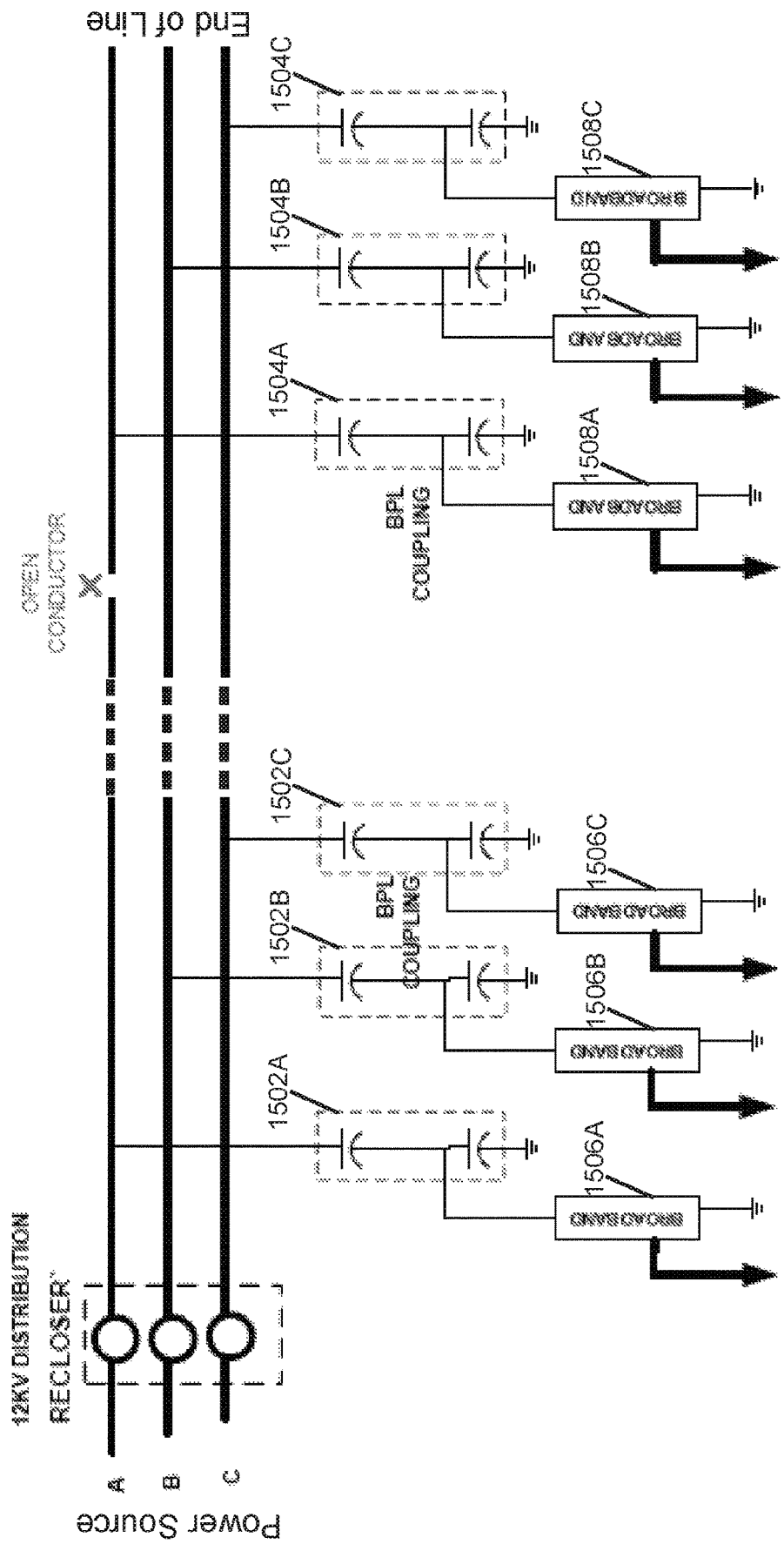
FIG. 15 illustrates a power network topology using broadband over power-line (BPL) to detect a broken conductor at an end of line device such that a recloser is prevented from closing.

Broadband over power line (BPL) is a technology that allows signals to be transmitted using power lines as a transmission medium. FIG. 15 depicts one such exemplary implementation, to provide end of line protection. This implementation may include signal injectors and extractors, such as broadband devices 1506 and 1508. These devices may include radios installed at an upstream utility pole and at downstream cabinet 610. In some exemplary implementations, the disclosed BPL approach may comprise injectors, which may be used to inject high frequency signals onto power lines, extractors, which may be used to retrieve these signals, and repeaters, which may be used to regenerate signals to prevent attenuation losses.

Broadband devices 1508 may be downstream at or near an end of the power distribution network, and devices 1508 may be configured to periodically transmit or receive signals over the power lines. In some exemplary implementations, if one or more of these devices do not receive a signal from one or more of broadband devices 1506 within a predetermined amount of time, that device 1508 may send, via a radio, an error signal upstream to block closure of the recloser. In other exemplary implementations, if one or more of broadband devices 1506 do not receive a signal from one or more of broadband devices 1508 within the predetermined amount of time, that device 1506 may send the error signal to block closure of the recloser. But these examples are not intended to be limiting, as different configurations may be used. For example, broadband devices 1508 may be configured to expect reception of a different type of signal (e.g., an acknowledgment signal that acknowledges successful reception of a signal from broadband device 1506) within the predetermined amount of time and send the error signal when that expectation is not met. Similarly, in another example, broadband devices 1506 may be configured to expect reception of the different type of signal (e.g., the acknowledgment signal that acknowledges successful reception of a signal from a broadband device 1508) within the predetermined amount of time and send the error signal when that expectation is not met. The predetermined time may be determined for a periodicity such that an error state is detected within an amount of time that it would take for one of the power lines to fall from a poll to the ground upon being severed (i.e., the severing being a cause of the error state). In some exemplary implementations, the periodicity of each of these signals (e.g., from device 1508A to device 1506A, from device 1508B to device 1506B, and from device 1508C to device 1506C) may be user-configured at the transmitting device, this device being, e.g., 270A or another relay of type 47N/59Q.

Rather than using a predetermined time for detecting a fault, some exemplary implementations may use a counter that tracks a number of missed or lost signals, and if that number satisfies a criterion the recloser may be blocked from closing a circuit due to suspicion of there being a broken conductor.

BPL uses radio spectrum ranging, e.g., from 1.6 to 80 MHz. Due to the electric current (e.g., at 50 Hz) and the radio spectrum having different frequencies, the two may not interfere with each other. BPL signal may be injected onto power lines between two phase conductors, between a phase conductor and the neutral conductor, or on a single phase or neutral conductor. The BPL signals may be injected into and extracted from the power lines through inductive or capacitive couplers.

The exemplary implementation depicted in FIG. 15 may further include instrument transformers 1502 and 1504. For example, instrument transformers 1502 and 1504 may include potential transformers, such as electromagnetic, capacitor (i.e., capacitor voltage transformer), and optical. In some exemplary implementations, instrument transformers 1502 and 1504 may comprise coupling capacitors or coils of any suitable value. While certain aspects herein may refer to instrument transformers, techniques described may be equally applicable to instrument transformers and power transformers.

In some exemplary implementations, instrument transformers 1502 may be installed near the recloser end to provide a means for the BPL signals from the remote (e.g., measurement) end to be received at the recloser location. The characteristic values of these transformers may be application specific. Instrument transformers 1502 and 1504 may be used to step the voltage down (e.g., from about 12,000 V to about 110 V) to create secondary control circuitry that is isolated from the high voltages or currents of the power distribution network. Broadband devices 1506 and 1508 may operate using power of the secondary control circuit. In some exemplary implementations, broadband devices 1506 and 1508 may operate using battery power. A charger inside cabinet 610 may be used to keep the one or more batteries fully charged, until there is a need for their use.

In addition to or instead of the other above-described techniques, another open conductor detection protection technique may be implemented via continuity tests. For example, at an interrupting device, phases A and B may be connected via high-value resistor (e.g., 1602, 1604) that has a value, e.g., between two and four times (e.g., between 2.5 and 3 times, which provides a safety margin to make sure normal conductor operation is not affected and each phase is independent during normal operation) higher than the voltage divided by current to prevent the phases from being shorted. At the end of the power line, a continuity tester may be in place. By having resistor 1602 between phases A and B (e.g., at or near transformer 1225A), the circuit may demonstrate an open circuit (i.e., a failure condition) or an expected continuity (i.e., with high resistance). More particularly, if phase A or B opens due to an open conductor, then the continuity may be detected to be broken. This technique may be replicated by adding similarly high-value resistor 1604 between phases B and C. In exemplary implementations, elements implementing the continuity method may be arranged upstream of fuses to allow for discrimination between blown fuses and down lines.

In some exemplary implementations, operation 1406 of FIG. 14 may comprise providing resistor 1602 between a first phase and a second phase of three phase power on a recloser side of a circuit. In some exemplary implementations, resistor 1602 may be a high impedance resistor. Operation 1406 may further comprise providing a continuity tester at an end-of line location. The continuity tester may comprise sensor 504 configured to measure an impedance between phases and tripping mechanism 506 configured to trigger transmitter 508 based on an abnormal condition (e.g., when the measured impedance equates to an open circuit). In some exemplary implementations, operation 1412 may thus comprise detecting, using the continuity tester, an open circuit (i.e., instead of the expected high resistance) in the circuit to determine an abnormal condition in the circuit.

Figure 16:
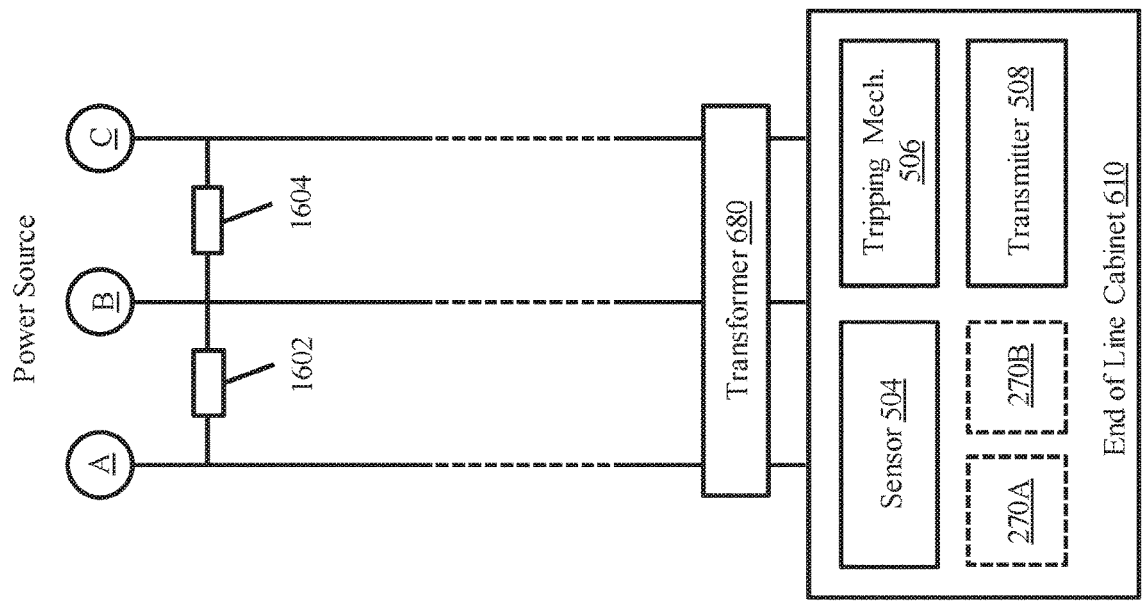
FIG. 16 illustrates a power network topology using high value resistors to detect a broken conductor at an end of line device such that a recloser is prevented from closing.

FIG. 16 depicts this other technique for providing end of line protection by monitoring continuity between two power line phases. In some exemplary implementations, upstream near a power source (e.g., at a start of a branch or near a power substation) and as close to the breaker or recloser as possible may be high impedance resistors 1602 and 1604. And, in some exemplary implementations, downstream near an end of line device may be one or more sensors 504. Sensors 504 (e.g., multimeter, voltmeter, another sensing device, or another suitable type of measuring instrument) may be configured to measure presence of resistor 1602 and/or resistor 1604. These resistors may be placed before a location (i.e., as close as possible to a power source) in the powerlines where a break can occur. In some exemplary implementations, downstream sensors 504 may be used to measure the high impedance as a confirmation of a healthy state of the power distribution network. But, if sensors 504 instead measure 0 Ohms (i.e., open-circuit), tripping mechanism 508 may be configured to trigger a trip signal that indicates a suspected conductor break. The trip signal may be sent, via transmitter 508, to an upstream recloser to block its closure.

For each phase to remain independent (e.g., due to an air gap between the three conductors) and not shorted, a high impedance resistor may be used. In some exemplary implementations with 12 kV, 21 kV, or higher voltage ratings, the resistor may be standardized based on the highest distribution system voltage.

At operation 1414 of FIG. 14, signals indicating one or more of the abnormal conditions from operations 1408, 1410, and/or 1412 may be received and combined at an interrupting device upstream from both a transmitter of each of these signals and from a root cause of the respective abnormal condition. The combination may be implemented in some exemplary implementations as an AND operation (i.e., where all signals need to agree that there is a problem) or as an OR operation (i.e., where only one of the signals needs to be asserted to a logic high level for blocking reclosing). As a result of this combination, the interrupting device may open and block reclosing, e.g., in the scenario of an open conductor. As such, these signals may be communicated independently. And these signals may be communicated over a wire (e.g., via Ethernet, fiber-optic, or other cabling) or wirelessly (e.g., via Bluetooth, Wi-Fi, radio frequency, or other wireless protocol). In some exemplary implementations, the signaling mechanism may be configured to utilize a preferred communication standard of an electrical utility. Where two or more techniques are used in combination, either technique may be used to determine an abnormal condition, or two or more detections of an abnormal condition may be utilized to confirm the abnormal condition, identify a type of failure (e.g., downed conductor versus blown fuse), identify the location of a failure, etc. In some exemplary implementations, operation 1414 of FIG. 14 may comprise generating and outputting an alarm when, after a predetermined or configurable amount of time, a receiver of system 200 fails to get a message.

Several exemplary implementations of the invention are specifically illustrated and/or described herein. However, it will be appreciated that modifications and variations are contemplated and within the purview of the appended claims.

What is claimed is:

1. A method for blocking a closure of an interrupting device, comprising:
providing a first resistor between a first phase and a second phase of a three-phase distribution network;
providing a second resistor between the second phase and a third phase of the three-phase network;
determining, via a continuity tester at an end of the network, an abnormal condition in the three-phase network based on an impedance measured between two of the phases; and
blocking, at least temporarily from closing, the interrupting device based on the determined condition.

2. The method of claim 1, wherein the blocking is performed by wirelessly receiving a signal.

3. The method of claim 2, wherein the signal is sent from another device to the interrupting device, the other device being where the abnormal condition is determined.

4. The method of claim 3, wherein the resistors are provided at or near a power substation or the interrupting device, which is at an opposite end of the three-phase network with respect to the other device.

5. The method of claim 1, wherein the abnormal condition comprises the measurement of an open circuit between the two phases.

6. The method of claim 1, wherein each of the resistors is a high impedance resistor.

7. The method of claim 6, wherein each of the high impedance resistors has a resistance at least equal to twice a voltage on a respective power line of the three-phase network divided by a current on the perspective power line.

8. The method of claim 1, further comprising:
manually inspecting the three-phase network such that a cause for the abnormal condition is determined, wherein the determined cause is an open conductor.

9. The method of claim 3, further comprising:
after the signal is sent, detecting normal functioning of the three-phase network; and responsive to the detection, transmitting a clear signal to the interrupting device such that the interrupting device closes a circuit associated with the interrupting device.

10. The method of claim 2, wherein one or more sensors that perform the measurement and a transmitter that transits the signal are housed in a weatherproof housing.

11. A method for blocking a closure of an interrupting device, comprising:
transmitting, via each of a set of power lines, a plurality of signals between the interrupting device and another device;
determining an abnormal condition based on an interruption of one or more of the signals; and
blocking, at least temporarily from closing, the interrupting device based on the determined condition; and,
further, wherein the signals are transmitted based on frequency diversity between different phases of the set of power lines such that electromagnetic interference is reduced, and
wherein one or more frequency bands at which the signals are transmitted are a plurality of orders of magnitude greater than a frequency at which a voltage on the power lines oscillates.

12. The method of claim 11, wherein the signals are continuously or periodically transmitted.

13. The method of claim 11, wherein the interruption comprises a timeout from reception of a previous signal successfully transmitted between the interrupting device and the other device.

14. The method of claim 11, wherein the interruption comprises a counter, which tracks a number of lost signals breaching a threshold.

15. The method of claim 11, wherein the abnormal condition is determined within an amount of time that it would take for one of the power lines to fall to the ground upon being severed.

16. The method of claim 11, wherein the signals are received by means of a repeater installed in between the interrupting device and the other device.

17. The method of claim 11, wherein the other device is a relay, and
wherein the other device is at an opposite end of the set of power lines with respect to the interrupting device.

18. The method of claim 11, wherein the interrupting device is a recloser or circuit breaker at or near a power substation.

19. The method of claim 11, wherein the blocking overrides another signal sent to the interrupting device with an intention to close a circuit associated with the interrupting device.

* * * * *